United States Patent
Jung et al.

(10) Patent No.: US 11,070,182 B2
(45) Date of Patent: Jul. 20, 2021

(54) IMAGE SENSOR AND OPERATING METHOD THEREOF

(71) Applicant: SAMSUNG ELECTRONICS CO., LTD., Suwon-si (KR)

(72) Inventors: Yun-hwan Jung, Hwaseong-si (KR); Sun-yool Kang, Hwaseong-si (KR); Hee-sung Chae, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 16/540,596

(22) Filed: Aug. 14, 2019

(65) Prior Publication Data

US 2020/0266785 A1    Aug. 20, 2020

(30) Foreign Application Priority Data

Feb. 14, 2019 (KR) .......................... 10-2019-0017404

(51) Int. Cl.
*H03F 3/50* (2006.01)
*H03F 3/68* (2006.01)

(52) U.S. Cl.
CPC .............. *H03F 3/505* (2013.01); *H03F 3/68* (2013.01); *H03F 2203/5012* (2013.01)

(58) Field of Classification Search
CPC .... H03F 3/505; H03F 3/68; H03F 2203/5012; H03F 2203/45534; H03F 3/45183; H04N 5/378; H04N 5/374; H04N 5/357
USPC ............. 330/252–261, 277, 295, 124 R, 310
See application file for complete search history.

(56) References Cited

U.S. PATENT DOCUMENTS

| | | | |
|---|---|---|---|
| 6,259,316 B1 | 7/2001 | Nagaraj | |
| 7,321,329 B2* | 1/2008 | Tooyama | ............ H03M 1/0607 341/163 |
| 7,405,720 B2 | 7/2008 | Nakajima et al. | |
| 7,944,303 B2 | 5/2011 | Cozzolino | |
| 9,325,335 B1* | 4/2016 | Milkov | ................ H03K 5/1534 |
| 9,641,774 B2* | 5/2017 | Shishido | ................ H04N 5/243 |
| 9,848,152 B1* | 12/2017 | Lin | ...................... H03M 1/0639 |
| 10,224,355 B2* | 3/2019 | Kim | ........................ H03M 1/08 |
| 2018/0175827 A1 | 6/2018 | Chen et al. | |

FOREIGN PATENT DOCUMENTS

| | | |
|---|---|---|
| JP | 11-214936 A | 8/1999 |
| JP | 2004-354560 A | 12/2004 |
| JP | 2006-094365 A | 4/2006 |

OTHER PUBLICATIONS

Gray, P., et al., "Analysis and Design of Analog Integrated Circuits", Jan. 20, 2009, 5th Edition, 902 pages total.

* cited by examiner

*Primary Examiner* — Hieu P Nguyen
(74) *Attorney, Agent, or Firm* — Sughrue Mion, PLLC

(57) ABSTRACT

An image sensor and an operating method of the image sensor are provided. An image sensor includes a pixel array including a plurality of pixels, a ramp signal generator configured to generate a first ramp signal, a buffer including an amplifier of a super source follower structure and outputting a second ramp signal obtained by buffering the first ramp signal, and an analog-to-digital conversion circuit configured to compare a pixel signal output from the pixel array with the second ramp signal and converting the pixel signal to a pixel value.

16 Claims, 15 Drawing Sheets

IMAGE SENSOR AND OPERATING METHOD THEREOF

CROSS-REFERENCE TO THE RELATED APPLICATION

This application claims priority from Korean Patent Application No. 10-2019-0017404, filed on Feb. 14, 2019, in the Korean Intellectual Property Office, the disclosure of which is incorporated herein in its entirety by reference.

BACKGROUND

Apparatuses and methods consistent with example embodiments of the inventive concept relate to an image sensor, and more particularly, to a method of operation of an image sensor and an image sensor capable of generating a high quality image while operating at low power.

An image sensor is a device that captures a two-dimensional or three-dimensional image of an object. The image sensor senses an image of the object by using a photoelectric conversion element that responds to the intensity of light reflected from the object, and generates image data. As complementary metal-oxide semiconductor (CMOS) technology has recently been developed, CMOS image sensors are widely used. As it is demanded from portable devices to provide users with high-resolution images, an image sensor that generates high-quality images while operating at low power is required.

SUMMARY

Various example embodiments of the inventive concept provide an image sensor capable of reducing deterioration of image quality due to noise generated in performing a comparison operation of comparators provided in an analog-to-digital conversion circuit of the image sensor and capable of operating at low power, and an operating method of the image sensor.

According to an aspect of example embodiments, there is provided an image sensor which may include: a pixel array including a plurality of pixels; a ramp signal generator configured to generate a first ramp signal; a buffer including an amplifier of a super source follower structure and configured to output a second ramp signal obtained by buffering the first ramp signal; and an analog-to-digital conversion circuit configured to compare a pixel signal output from the pixel array with the second ramp signal and convert the pixel signal to a pixel value.

According to another aspect of the example embodiments, there is provided an image sensor which may include: a pixel array including a plurality of pixels; a ramp signal generator configured to generate a first ramp signal; a buffer circuit including a plurality of buffers having a super source follower structure, each of which buffers the first ramp signal to generate a second ramp signal; and a plurality of analog-to-digital converters configured to compare a plurality of pixel signals output from the pixels with the second ramp signal to generate pixel values.

According to another aspect of the example embodiments, there is provided an operating method of an image sensor which may include: changing, by using a buffer, an input range of the buffer by performing an input sampling operation in a first period; outputting, by using the buffer, a buffered ramp signal by buffering a received ramp signal in a second period; by using a comparator, comparing a pixel signal and the buffered ramp signal and outputting a comparison result in the second period; and generating, by using a counter, a pixel value by counting the comparison result in the second period.

BRIEF DESCRIPTION OF THE DRAWINGS

The example embodiments of the inventive concept will be more clearly understood from the following detailed description taken in conjunction with the accompanying drawings in which.

DETAILED DESCRIPTION OF THE EXAMPLE EMBODIMENTS

Hereinafter, various embodiments of the inventive concept will be described in detail with reference to the accompanying drawings. These embodiments are all exemplary, and thus, the inventive concept should not be limited thereto.

Figure 1:
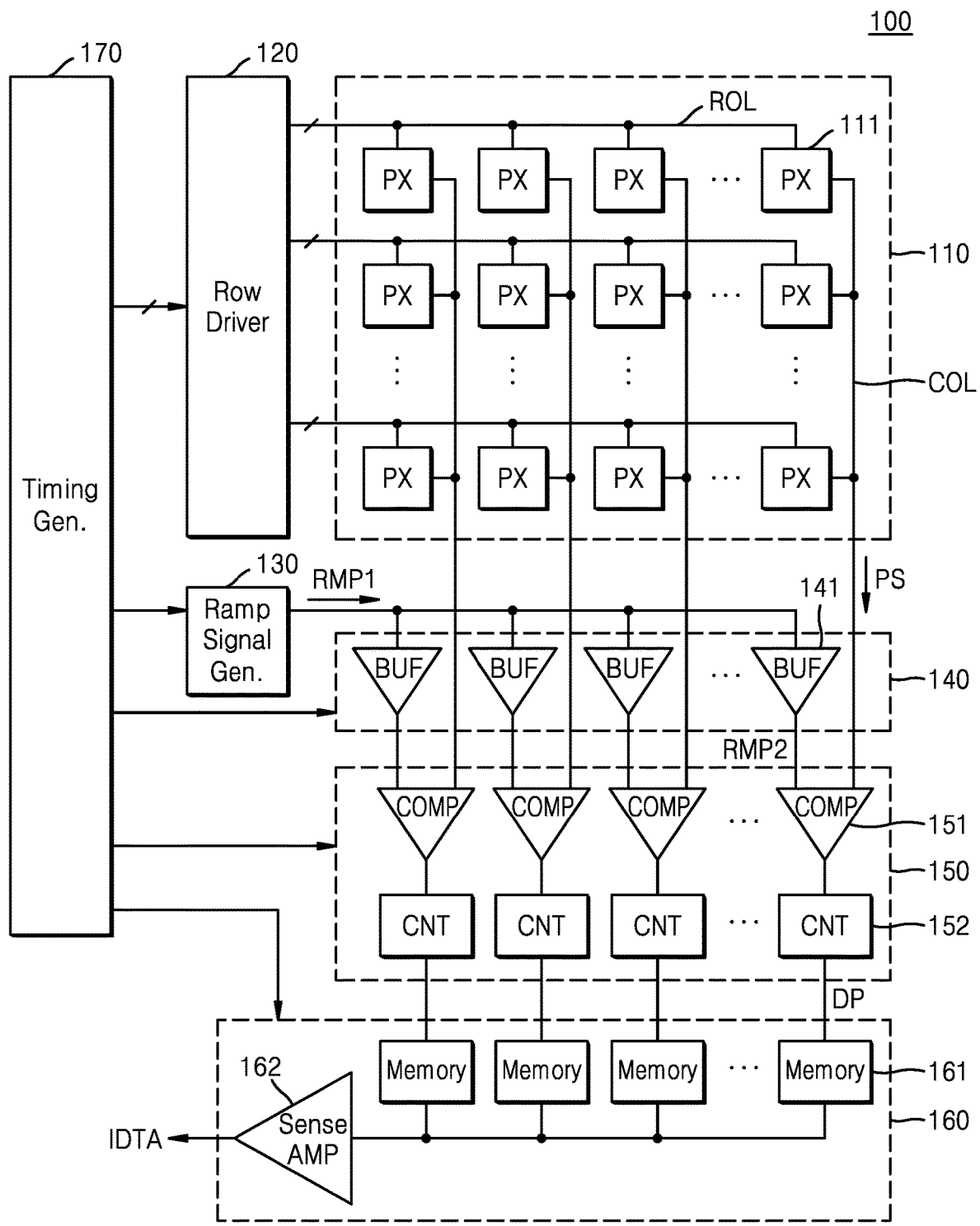
FIG. 1 is a block diagram illustrating an image sensor according to an embodiment.

FIG. 1 is a block diagram illustrating an image sensor according to an embodiment.

An image sensor 100 may be mounted on an electronic device having an image or light sensing function. For example, the image sensor 100 may be mounted on an electronic device such as a camera, a smartphone, a wearable device, an Internet of Things (IoT) device, a tablet personal computer (PC), a personal digital assistant (PDA), a portable multimedia player (PMP), navigation, a drone, and an advanced drivers assistance system (ADAS). Also, the image sensor 100 may be mounted on an electronic device provided as a part of a vehicle, furniture, a manufacturing facility, a door, and various measuring instruments.

The image sensor 100 may include a pixel array 110, a row driver 120, a ramp signal generator 130, a buffer circuit 140, an analog-to-digital conversion circuit 150, an output buffer 160, and a timing generator 170. In addition, the image sensor 100 may further include additional configurations for improving image sensing sensitivity.

The pixel array 110 may include a plurality of row lines ROL, a plurality of column lines COL, and a plurality of pixels 111 each connected to the row lines ROL and the column lines COL and arranged in a matrix form. Through the row lines ROL, a row select signal and a pixel control signal are transmitted to a connected pixel PX.

Each of the plurality of pixels 111 may include a photo sensing element, and may sense light by using a photo sensing device and convert the sensed light into a pixel signal PS which is an electrical signal. For example, the photo sensing device may include a photo diode, a photo transistor, a photo gate, or a pinned photodiode. Each of the plurality of pixels 111 may include at least one photo sensing element, and in an embodiment, each of the plurality of pixels 111 may include a plurality of photo sensing elements. The plurality of photo-sensing elements may be stacked on each other.

The row driver 120 drives the pixel array 110 on a row basis. The row driver 120 may decode a row control signal (e.g., an address signal) provided from the timing generator 170, and in response to the decoded row control signal, the row driver 120 may select at least one row from among the rows constituting the pixel array 110. For example, the row driver 120 may generate a row select signal. The row select signal and the pixel control signal for controlling the selected pixel may be provided to the pixel PX via a row line ROL. The pixel signals PS are output from the pixels PX of the row selected by the row selection signal provided from the row driver 120. The pixel signal PS may comprise a reset signal and an image signal. A signal level difference (for example, a voltage difference) between the reset signal and the image signal may include information on the amount of light received by each of the plurality of pixels 111. For example, when a pixel 111 does not receive light, the reset signal and the image signal are the same, and when the pixel 111 receives light, a voltage of the reset signal and a voltage of the image signal may be different.

A ramp signal generator 130 may generate a first ramp signal RMP1. The ramp signal generator 130 may operate based on a ramp control signal provided from the timing generator 170. The ramp control signal from the timing generator 170 may include a ramp enable signal, a mode signal, and the like. The ramp signal generator 130 may generate a first ramp signal RMP1 having a slope set based on the mode signal when the ramp enable signal is activated. Herein, the slope indicates a slope of change in a voltage level of the first ramp signal along a time axis as shown in FIG. 3B to be discussed later.

The buffer circuit 140 may buffer the first ramp signal RMP1 provided from the ramp signal generator 130 to generate a second ramp signal RMP2. The buffer circuit 140 may include one or more buffers 141. The buffer 141 may include an amplifier of a super source follower structure, and the amplifier may buffer the first ramp signal RMP1 to generate the second ramp signal RMP2. In an embodiment, the buffer 141 may further include an input circuit coupled to an input terminal of the amplifier. The input circuit may receive the first ramp signal RMP1, and may provide a signal obtained by adding a biasing voltage to the first ramp signal RMP1 as an input signal to the amplifier. Accordingly, an input range of the buffer 141 may be calibrated or shifted such that the input range of the buffer 141 includes a range of the first ramp signal RMP1. Herein, the range indicates a range of a signal level (or a voltage level of a signal). For example, the range of the first ramp signal RMP1 indicates a range of a level (or a voltage level) of the first ramp signal RMP1 as shown in FIG. 3B.

The amplifier of the super source follower structure has a voltage gain close to 1, but has a large input resistance and a low output resistance, so that the input signal to the amplifier may be output as an output signal with almost no loss. Thus, the buffer circuit 140 may output a second ramp signal RMP2 having a range and a slope that is substantially equal to the range and slope of the first ramp signal RMP1. The image sensor 100 according to an embodiment in which the buffer 141 is employed will be described in detail below with reference to FIGS. 3A to 13.

The analog-to-digital conversion circuit 150 may convert pixel signals PS input from the pixel array 110 into digital pixel values DP. The analog-to-digital conversion circuit 150 may include a plurality of comparators 151 and a plurality of counters 152. A comparator 151 for receiving a pixel signal PS from a corresponding one of the plurality of column lines COL and a counter 152 connected to the output of the comparator 151 may constitute one analog-to-digital converter (hereinafter, referred to as ADC, i.e., ADC 153 in FIG. 3A). The ADC may convert a pixel signal PS received through the connected column line COL into a digital pixel value DP.

The comparator 151 may compare the received pixel signal PS with a buffered ramp signal, that is, the second ramp signal RMP2 output from the buffer 141 to output a comparison result as a logic low or a logic high. The comparator 151 may generate the comparison result to which a correlated double sampling technique is applied, and may be referred to as a correlated double sampling circuit.

The plurality of pixel signals PS output from the plurality of pixels 111 may have deviations due to an inherent characteristic of each pixel PX (e.g., fixed pattern noise (FPN), etc.) and/or due to difference in characteristics of logic for outputting the pixel signal PS from the pixel 111 (e.g., transistors for outputting photo charges stored in the photoelectric conversion elements in the pixel 111). As described above, obtaining a reset signal (or a reset component) and an image signal (or an image component) with respect to the pixel signal PS and extracting a signal level difference (e.g., a voltage difference) between the reset signal and the image signal as a valid signal component to compensate for the deviations between the plurality of pixel signals PS output via the plurality of column lines COL is referred to as correlated double sampling. The comparator 151 may output a comparison result (e.g., a comparison signal) to which the correlated double sampling technique is applied.

The counter 152 may be connected to an output of the comparator 151, and may count a comparison result output from the comparator 151. The counter 152 may count a comparison result of a logic high or logic low output from the comparator 151 based on a counting clock signal in a reset conversion period for sensing the reset signal and a signal conversion period for sensing the image signal, and may output a digital pixel value DP based on a counting result.

The output buffer 160 may temporarily store a plurality of digital pixel values DP output from the plurality of counters 152 to amplify and output the stored digital pixel values DP. The output buffer 160 may include a plurality of memories 161, and a sense AMP 162. Each of the plurality of memories 161 may temporarily store the digital pixel value DP output from each of the plurality of counters 152, and then may sequentially or selectively output the stored digital pixel value DP to the sense AMP 162, and the sense AMP 162 may sense and amplify the received digital pixel value DP to output the amplified digital pixel value DP. The sense AMP 162 may output a plurality of amplified digital pixel values DP as image data IDTA.

The timing generator 170 may provide a control signal and/or a clock signal corresponding to each of the components of the image sensor 100 such as the row driver 120, the ramp signal generator 130, the buffer circuit 140, the analog-to-digital conversion circuit 150, and the output buffer 160. The row driver 120, the ramp signal generator 130, the buffer circuit 140, the analog-to-digital conversion circuit 150, and the output buffer 160 may operate at respective timing sets based on the control signal and/or the clock signal provided from the timing generator 170. For example, the counter 152 of the analog-to-digital conversion circuit 150 may receive a counting signal and a clock signal, which is a counting clock signal, from the timing generator 170. The counter 152 may count a comparison result output from the comparator 151 based on the counting clock in a period in which the counting signal is active, for example, in a period in which the counting signal is a logic high.

Figure 2A:
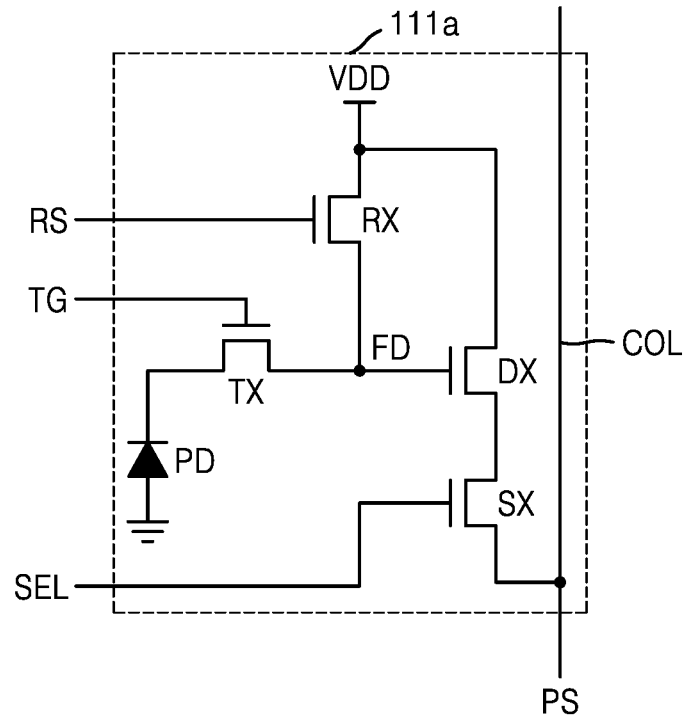
FIGS. 2A and 2B are circuit diagrams illustrating an embodiment of the pixel of FIG. 1.
Figure 2B:
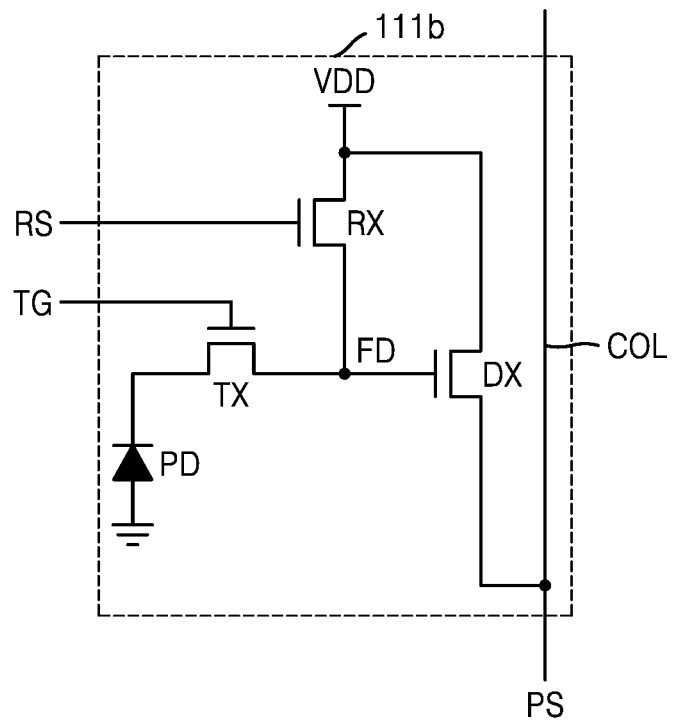

FIGS. 2A and 2B are circuit diagrams illustrating an embodiment of the pixel of FIG. 1.

Referring to FIG. 2A, a pixel 111*a* may include a photodiode PD, a transmission transistor Tx, a floating diffusion node FD, a reset transistor RX, a drive transistor DX, and a selection transistor SX. The photodiode PD may be an example of a photoelectric conversion element, and may be replaced with another type of photoelectric conversion element.

The photodiode PD may generate light charges which vary depending on an intensity of incident light. The transmission transistor TX may transmit the light charges to the floating diffusion node FD in accordance with a transmission control signal TG provided from the row driver 120 in FIG. 1. The drive transistor DX may amplify and transmit the light charges to the selection transistor SX in accordance with a potential due to the light charges accumulated in the floating diffusion node FD. A drain of the selection transistor SX may be connected to a source of the drive transistor DX, and a pixel signal PS may be output to the column line COL connected to the pixel 111*a* in accordance with the selection signal SEL output from the row driver 120. The reset transistor RX may reset the floating diffusion node FD to a power supply voltage VDD level in accordance with a reset control signal RS provided from the row driver 120.

As described above with reference to FIG. 1, the pixel signal PS is either a reset signal or an image signal. The reset signal is a signal output from the selection transistor SX after the floating diffusion node FD is reset to the power supply voltage VDD by the reset transistor RX. The image signal may be a signal that the selection transistor SX outputs after the floating diffusion node FD completes the transmission of light charges from the transmission transistor TX. The pixel 111*a* may sequentially output the reset signal and the image signal as the pixel signal PS under control of the row driver 120.

A pixel 111*b* illustrated in FIG. 2B is a unit pixel having a 3-transistor (3T) structure, and may include a photodiode PD, a transmission transistor TX, a reset transistor RX, and a drive transistor DX. The reset transistor RX may be implemented as an n-channel depression type transistor. The reset transistor RX may reset the floating diffusion node FD to the power supply voltage VDD in accordance with the reset control signal RS output from the row driver 120, or may perform a similar function to the selection transistor SX by setting the floating diffusion node FD to a low level (e.g., 0 V).

The pixel 111*a* of a 4T structure including one photodiode PD and four MOS transistors TX, RX, DX, and SX and the pixel 111*b* of a 3-transistor (3T) structure have been exemplarily described with reference to FIGS. 2A to 2B. However, the structure of the pixel is not limited thereto, and may be variously changed. A pixel may be implemented as a 3T-, 4T-, or 5T-unit pixel of different structures, and the pixels may be implemented as a circuit including a photoelectric conversion element that generates light charges in accordance with the intensity of light or light quantity and at least one transistor that may output light charges generated by the photoelectric conversion element as a current or a voltage signal.

Figure 3A:
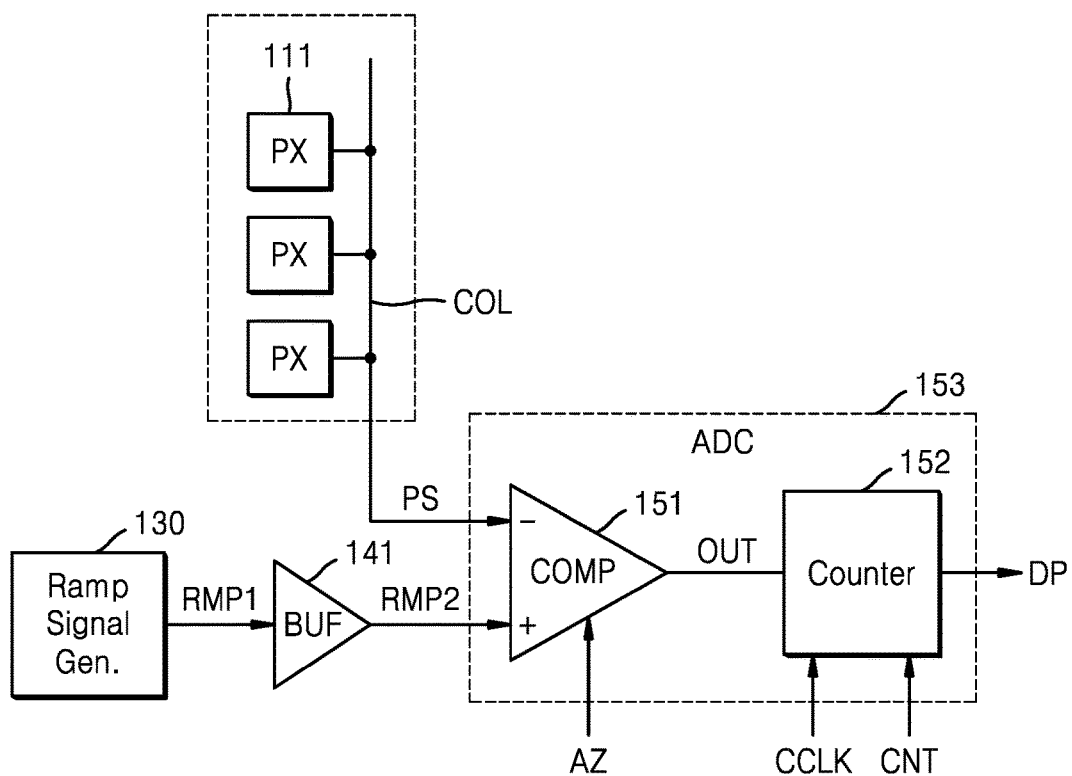
FIG. 3A is a block diagram schematically illustrating a read circuit that converts a pixel signal to a digital pixel value, according to an embodiment.
Figure 3B:
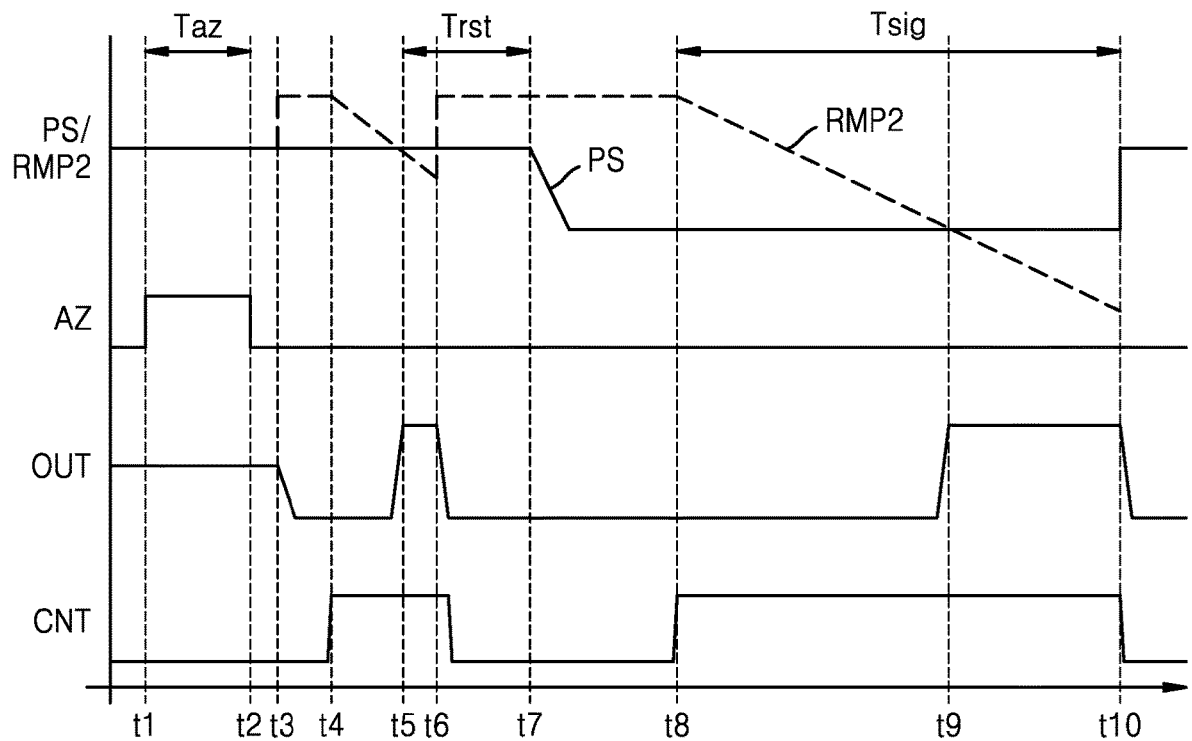
FIG. 3B illustrates an operation of a read circuit of FIG. 3A.

FIG. 3A is a block diagram schematically illustrating a read circuit for converting a pixel signal to a digital pixel value, according to an embodiment, and FIG. 3B illustrates an operation of the read circuit of FIG. 3A.

The read circuit of FIG. 3A includes the ramp signal generator 130, the buffer 141, and the ADC 153 of FIG. 1. The ADC 153 may include the comparator 151 and the counter 152. The pixels 111 connected to the column line COL are illustrated together.

Referring to FIG. 3A, a pixel signal PS may be output from a pixel 111 selected by a row selection signal among the pixels 111 connected to a column line COL. The buffer 141 may buffer a ramp signal output from the ramp signal generator 130, that is, a first ramp signal RMP1, and provide a second ramp signal RMP2 obtained by buffering the first ramp signal RMP1 to the comparator 151. As described above with reference to FIG. 1, the buffer 141 may include an amplifier of a super source follower structure. Since an output resistance of the buffer 141 is very low, the first ramp signal RMP1 may be buffered and provided to the comparator 151 as the second ramp signal RMP2 without signal loss.

The comparator 151 may compare the pixel signal PS with the second ramp signal RMP2 to output a comparison result. In an embodiment, the comparator 151 may be implemented with one or more amplifiers, such as an operational transconductance amplifier (OTA).

The comparator 151 may perform an auto-zero operation in an auto-zero period before a comparison operation is performed. In response to an auto-zero signal AZ, an input and an output of the amplifier implemented in the comparator 151 may be connected each other, and thus the input and the output of the amplifier implemented in the comparator 151 may have the same voltage level, and an offset of the amplifier may be cancelled.

The counter 152 may count an output OUT (i.e., the comparison result) of the comparator 151 in the reset conversion period and the signal conversion period in response to a count signal CNT (a counting enable signal) of an active level, and thus output a digital pixel value DP indicating information on the amount of light received by the pixel 111, that is, the pixel 111 that has output the pixel signal PS. The counter 152 may count a time in which a specific level of the output OUT of the comparator 151, for example, a logic high or a logic low is maintained, for a duration during which the count signal CNT is activated, based on a counting clock signal CCLK.

The counter 152 may include an up/down counter and a bit-wise inversion counter. The bit-wise counter may perform an operation similar to the up/down counter. For example, the bit-wise counter may perform a function of performing up-count only and a function of inverting all bits in the counter to 1's complement when a specific signal is received. The bit-wise counter may perform a reset count, and then, invert a result of the reset count to convert the inversion result to 1's complement, that is, a negative value, and thus the bit-wise counter may perform a signal count based on the converted value. For example, the counter 152 may count the digital value of the reset signal in the reset conversion period in the comparison operation period, invert the counted digital value of the reset signal, and count a digital value of an image signal in the signal conversion period on the basis of the inverted digital value of the reset signal. Accordingly, the digital pixel value DP from which the reset signal is removed may be output.

In a graph of FIG. 3B, a horizontal axis represents time and a vertical axis represents levels of signals of the read circuit of FIG. 3A. A period from time points t3 to t10 may be defined as a comparison operation period in which a comparison operation (i.e., correlation double sampling) is performed. Prior to the comparison operation period, an auto-zero operation may be performed for at least some periods. For example, an auto-zero signal AZ may be activated in an auto-zero period Taz from time points t1 to t2, and the comparator 151 may perform the auto-zero operation in response to the activated auto-zero signal AZ. In an embodiment, the buffer 141 may perform a self-biasing operation (or an input sampling operation) in the auto zero period Taz. The self-biasing operation of the buffer 141 will be described with reference to FIG. 4.

For digital conversion of a reset signal, a reset conversion operation may be performed during a reset conversion period Trst. After an offset is applied to a second ramp signal RMP2 at time point t3, the second ramp signal RMP2 may decrease from time point t4. When the count signal CNT is in an active level (for example, a logic high), the counter 152 may count a counting clock signal CCLK from time point t4 to t5 when an output OUT of the comparator 151 changes.

When the digital conversion of the reset signal is completed, a signal conversion operation may be performed during a signal conversion period Tsig to convert an image signal into a digital signal.

After an offset is applied again to the second ramp signal RMP2 at time point t6, the pixel signal PS may change at time point t7 by charges accumulated in the pixel 111.

The second ramp signal RMP2 may decrease from time point t8, and when the count signal CNT is in an active level, the counter 152 may count the counting clock signal CCLK from time point t8 to time point t9 when the output OUT of the comparator 151 changes.

In FIG. 3B, the counter 152 is illustrated convert an image signal to a digital signal through bit-conversion and up-counting, but the inventive concept is not limited thereto. The counter 152 may be implemented in various ways. In addition, although the second ramp signal RMP2 is illustrated as linearly decreasing from a high voltage level to a low voltage level in the reset transition period Trst and the signal conversion period Tsig, the inventive concept is not limited thereto. According to an embodiment, the second ramp signal RMP2 may increase linearly from the low voltage level to the high voltage level.

When the digital conversion of the image signal is completed, the read circuit may be initialized for correlated double sampling on pixels 111 of a next row. The operation timing of the read circuit has been described with reference to FIG. 3B. However, this is illustrative and the timing of the signals may vary depending on how the ADC 153 is implemented, for example, the structure of the comparator 151 and the counter 152, and so on.

Figure 4:
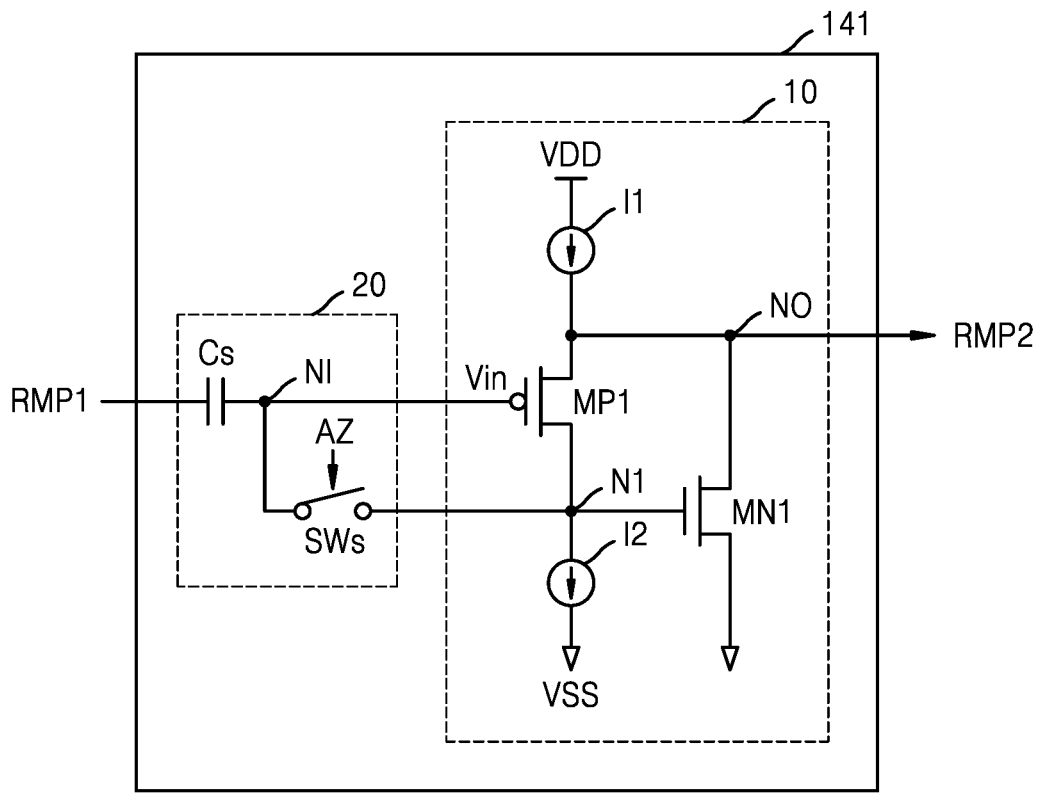
FIG. 4 is a circuit diagram illustrating a buffer according to an embodiment.

FIG. 4 is a circuit diagram illustrating a buffer according to an embodiment.

As described with reference to FIGS. 1 and 3A, the buffer 141 may be disposed between the ramp signal generator 130 and the comparator 151, and may buffer the first ramp signal RMP1 output from the ramp signal generator 130 to generate the second ramp signal RMP2. The buffer 141 may provide the second ramp signal RMP2 to the comparator 151.

The buffer 141 may include an amplifier 10 and an input circuit 20 of a super source follower structure. The amplifier 10 may include a first current source I1, a second current source I2, and a first transistor MP1 which constitute a source follower and a second transistor MN1 which operates as a negative feedback circuit. The first current source I1 may be connected to the power source voltage VDD and a source terminal of the first transistor MP1, and the second current source I2 may be connected to the ground voltage VSS and a drain terminal of the first transistor MP1. A gate terminal of the first transistor MP1 may be connected to an input node NI of the amplifier 10, and a source terminal of the first transistor MP1 may be connected to an output node NO of the amplifier 10. A gate terminal of the second transistor MN1 may be connected to a drain terminal of the first transistor MP1, and a drain terminal of the second transistor MN1 may be connected to the source terminal of the first transistor MP1 and the output node NO.

The first transistor MP1 and the second transistor MN1 may be implemented by different types of metal-oxide-semiconductor field-effect transistors (MOSFET) (hereinafter, referred to as MOS transistors). For example, as illustrated in FIG. 4, the first transistor MP1 may be implemented as a P-type MOS transistor (PMOS), and the second transistor MN1 may be implemented as an N-type MOS transistor (NMOS). At this time, an amount of a first reference current provided by the first current source I1 may be greater than an amount of a second reference current provided by the second current source I2.

As the negative feedback circuit, that is, the second transistor MN1, is connected to the source follower, an output resistance of the amplifier 10 may be relatively much lower than an output resistance of the source follower. The output resistance of the amplifier 10 will be described later with reference to FIG. 5.

The input circuit 20 may include a switch SWs connected to the input node NI of the amplifier 10 and the drain terminal of the first transistor MP1 and a capacitor Cs having one terminal connected to the input node NI of the amplifier 10 and the other terminal to which the first ramp signal RMP1 is applied. The switch SWs may be implemented by a transmission gate or an NMOS transistor.

The switch SWs may be turned on before the comparison operation period (i.e., the period during which correlated double sampling is performed) and turned off during the comparison operation period. In an embodiment, the switch SWs may be turned on in the auto-zero period (Taz in FIG. 3B) in response to the auto-zero signal AZ. However, the inventive concept is not limited thereto, and the switch SWs may be turned on in response to a control signal activated at least during a period prior to the comparison operation period. Hereinafter, in the inventive concept, it is assumed that the switch SWs is turned on in response to the auto-zero signal AZ.

The switch SWs may be turned on, and thus a voltage of the gate terminal of the second transistor MN1, that is, a gate-source voltage Vgs.mn1 (e.g., a voltage difference between a gate terminal and a source terminal) of the second transistor MN1 may be stored in the capacitor Cs. That is, the gate-source voltage Vgs.mn1 of the second transistor MN1 may be sampled at the input node NI as the switch SWs is turned on. This will be referred to as a self-biasing operation (or an input sampling operation) of the input circuit 10.

The gate-source voltage Vgs.mn1 of the second transistor MN1 may be added to an input Vin of the amplifier 10 as an offset, and thus, after the switch SWs is turned off, the input Vin of the amplifier 10 may have a value obtained by adding an offset to the first ramp signal RMP1, to which an offset is added.

In order for the amplifier 10 to operate normally, that is, to ensure the linearity of the second ramp signal RMP2, which is an output of the amplifier 10, the input Vin (i.e., a level of an input signal) of the amplifier 10 is required to satisfy Equation 1 below.

$$Vin \geq Vgs.mn1 + Vsd.mp1 - Vsg.mp1 \qquad (1)$$

Here, Vsd.mp1 and Vsg.mp1 represent a source-drain voltage and a source-gate voltage of the first transistor MP1, respectively. The gate-source voltage Vgs.mn1 of the second transistor MN1, the source-drain voltage Vsd.mp1 and the source-gate voltage Vsg.mp1 of the first transistor MP1 are set such that an amount of induced current is a proper value. For example, minimum values of the gate-source voltage Vgs.mn1 of the second transistor MN1 and the source-gate voltage Vsg.mp1 of the first transistor MP1 may be equal to a threshold voltage of the second transistor MN1 and a threshold voltage of the first transistor MP1, respectively.

As described above, since the gate-source voltage Vgs.mn1 of the second transistor MN1 is added as an offset to the input Vin of the amplifier 10 by self biasing, the input Vin of the amplifier 10 may be expressed by Equation 2 below.

$$Vin = RMP1 + Vgs.mn1 \qquad (2)$$

Equations 3 and 4 may be derived from Equations 1 and 2 as follows.

$$RMP1 + Vgs.mn1 \geq Vgs.mn1 + Vsd.mp1 - Vsg.mp1 \qquad (3)$$

$$RMP1 \geq Vsd.mp1 - Vsg.mp1 (= -Vd.mp1 + Vg.mp1) \qquad (4)$$

Here, Vd.mp1 and Vg.mp1 represent the drain terminal voltage and the gate terminal voltage of the first transistor MP1, respectively. Since the drain terminal voltage Vd.mp1 and the gate terminal voltage Vg.mp1 of the first transistor MP1 are the same by sampling, the buffer 141 may operate normally when the first ramp signal RMP1 is 0 V (volt) or more. When the first ramp signal RMP1 increases from 0 V, the second ramp signal RMP2 having the same slope as a slope of the first ramp signal RMP1 may be output. In other words, even though a voltage level of the first ramp signal RMP1 is very low (e.g., near 0 V), the linearity of the buffer 141, that is, the linearity of the second ramp signal RMP2 may be ensured.

As described above, the buffer 141 according to the present embodiment may include the amplifier 10 of the super source follower structure, and thus an output resistance of the buffer 141 is very low. In addition, an input range of the buffer 141 may be corrected to match the range of the first ramp signal RMP1 by a self biasing operation of the input circuit 10, and thus, the linearity of the second ramp signal RMP2 may be ensured.

Figure 5:
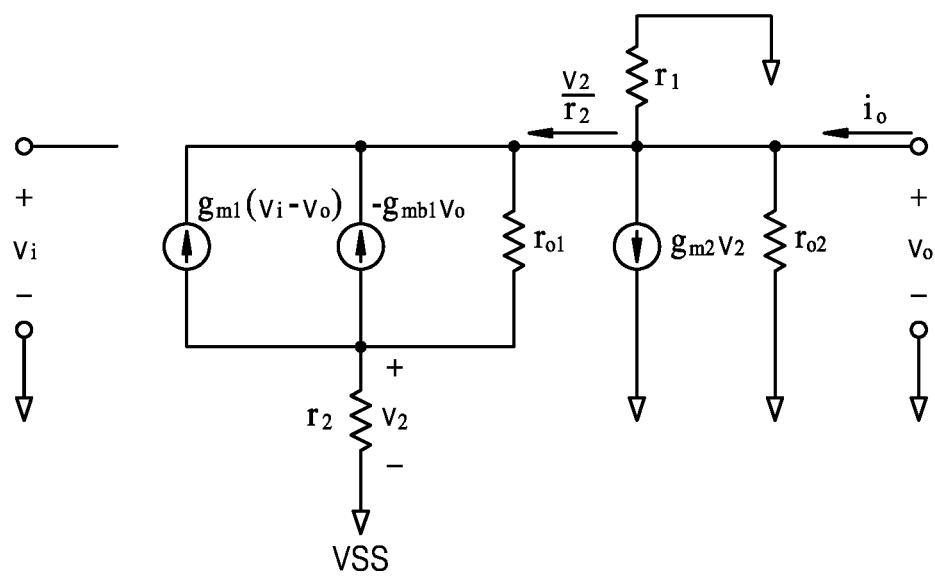
FIG. 5 illustrates a small-signal equivalent circuit of an amplifier of a super source follower structure.

FIG. 5 illustrates a small-signal equivalent circuit of an amplifier of a super source follower structure.

The small-signal equivalent circuit illustrated in FIG. 5 is a small-signal equivalent circuit of the amplifier 10 illustrated in FIG. 4, and corresponds to an equivalent circuit when the amplifier 10 operates in a saturation region. $g_{m1}$ and $g_{mb1}$ represent a transconductance and a body transconductance of the first transistor MP1 respectively, $r_1$ represents a resistance of the first current source I1, $r_2$ and $v_2$ represent a resistance of the second current source I2 and a voltage across the second current source $I_2$, respectively, and $g_{m2}$ denotes the transconductance of the second transistor MN1, $r_{o1}$ and $r_{o2}$ represent output resistances of the first transistor MP1 and an output resistance of the second transistor MN1, respectively.

An output resistance $R_o$ of the amplifier 10 may be a value obtained by dividing an output voltage $v_o$ (i.e., a small signal output voltage) by an output current $i_o$ (i.e., the small signal output current) when the input voltage $v_i$ (i.e., the small signal input voltage) is 0, and may be calculated according to Equation 5 below.

$$R_o = \frac{v_o}{i_o}\bigg|_{v_i=0} = r_1 \| r_{o2} \| \left( \frac{r_{o1} + r_2}{[1 + (g_{m1} + g_{mb1})r_{o1}](1 + g_{m2}r_2)} \right) \qquad (5)$$

When the first current source I1 and the second current source I2 are ideal current sources. and $r_1$ and $r_2$ are infinite values, an output resistance $R_o$ may be expressed by Equation 6 below.

$$R_o \simeq \frac{1}{g_{m1} + g_{mb1}} \left( \frac{1}{g_{m2}r_{o1}} \right) \qquad (6)$$

In general, the output resistance $R_o$ may be $1/(g_{m1} \cdot g_{m2} \cdot r_{o1})$.

An output resistance of a typical source follower may be $1/g_{m1}$. Accordingly, it may be seen that an output resistance $R_o$ of a super source follower is relatively smaller than that of the source follower.

Figure 6A:
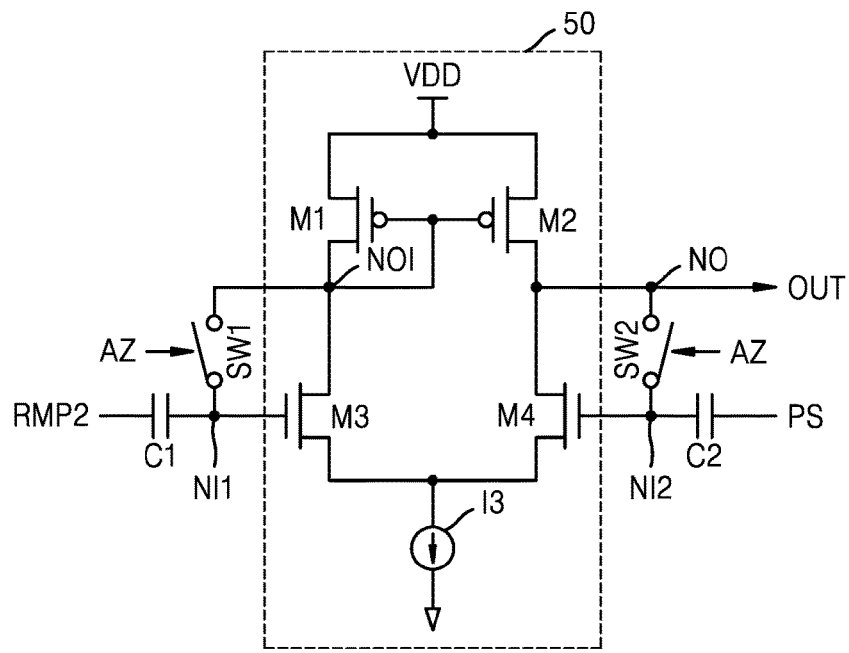
FIGS. 6A and 6B are circuit diagrams illustrating a comparator according to embodiments.
Figure 6B:
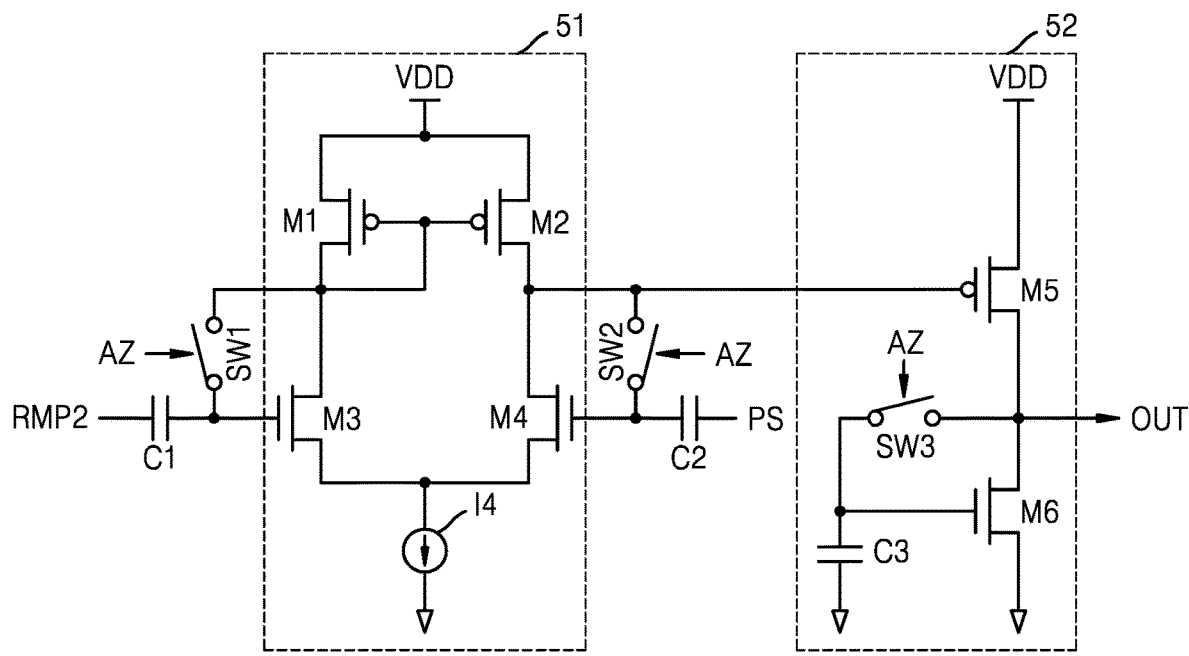

FIGS. 6A and 6B are circuit diagrams illustrating a comparator 151a according to embodiments.

Referring to FIG. 6A, the comparator 151a may include an amplifier 50 and peripheral circuits coupled to an input node and/or an output node of the amplifier 50. The peripheral circuits may include a first capacitor C1, a second capacitor C2, a first switch SW1, and a second switch SW2.

The amplifier 10 may include first to fourth transistors M1 to M4 and a current source I3, and may be implemented as an OTA. The first switch SW1 and the second switch SW2 may be connected to input nodes NI1 and NI2 and output nodes NOI and NO of the amplifier 50, respectively, and an offset of the amplifier 50 may be removed as the first and second switches SW1 and SW2 are turned on in response to an auto-zero signal AZ.

A second ramp signal RMP2 may be applied to a first input node NI1 of the amplifier 50 through the first capacitor C1, and a pixel signal PS may be applied to a second input node NI2 of the amplifier 50 through the second capacitor C2. The first capacitor C1 and the second capacitor C2 may be provided for removal of noise.

Referring to FIG. 6B, a comparator 151b may be implemented as a two-stage amplifier. The comparator 151b may include a first amplifier 51, a second amplifier 52, and peripheral circuits connected to an input node and/or an output node of the first amplifier 51.

Operations of the first amplifier 51 and the peripheral circuits are the same as those in FIG. 6A, and a duplicate description thereof will be omitted. The second amplifier 52 may include a fifth transistor M5, a sixth transistor M6, a third capacitor C3, and a third switch SW3, and may be implemented as an OTA of a common source follower structure. The fifth transistor M5 and the sixth transistor M6 may be different types of MOS transistors. During an auto-zero period, the third switch SW3 may be turned on in response to an auto-zero signal AZ, and an offset of the second amplifier 52 may be eliminated.

The comparators 151a and 151b have been described with reference to FIGS. 6A and 6B. However, the present inventive concept is not limited thereto, and the comparator may be implemented with various kinds of amplifier circuits.

Figure 7A:
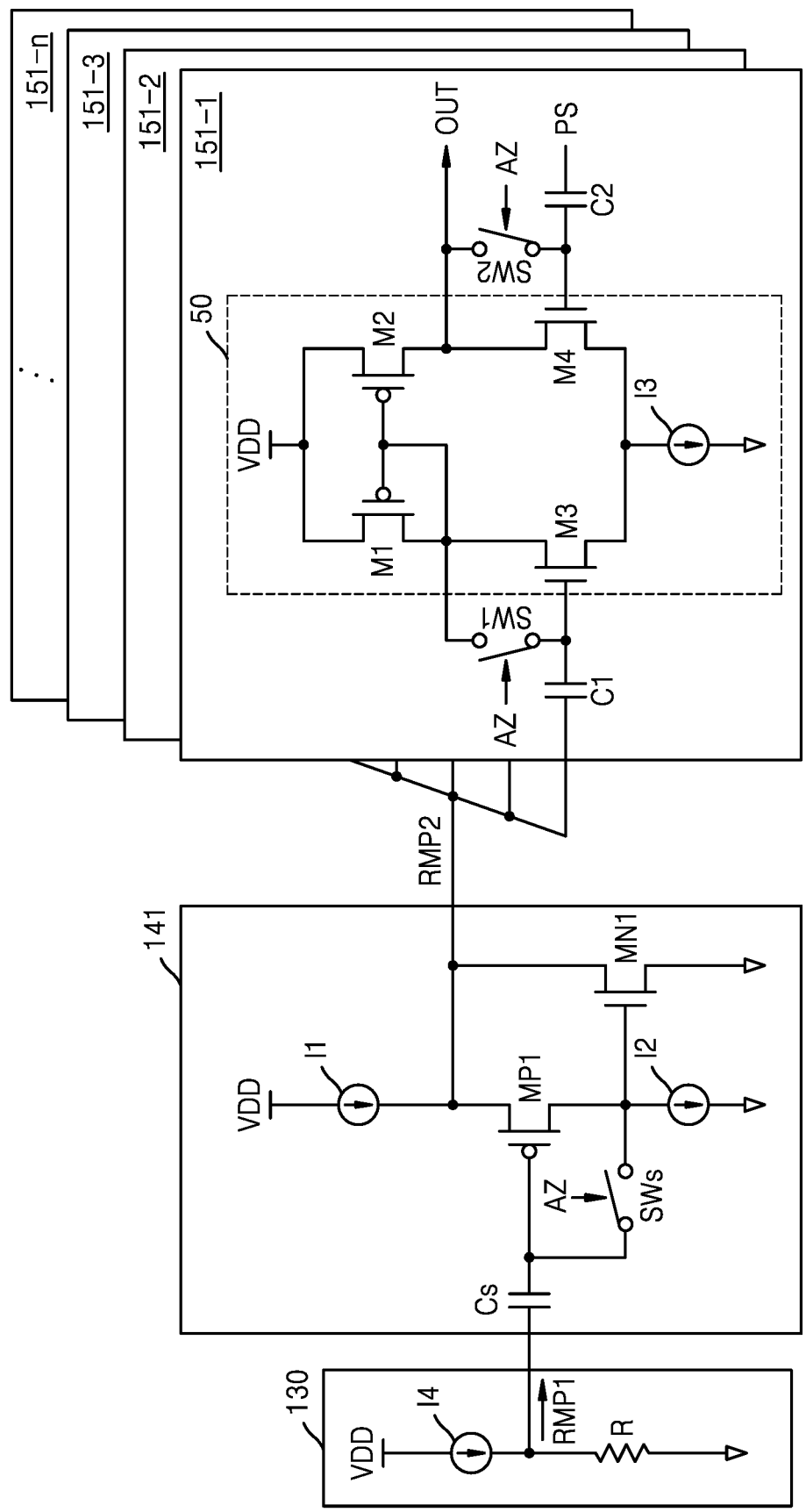
FIGS. 7A and 7B are circuit diagrams illustrating a read circuit including a buffer according to an embodiment.
Figure 7B:
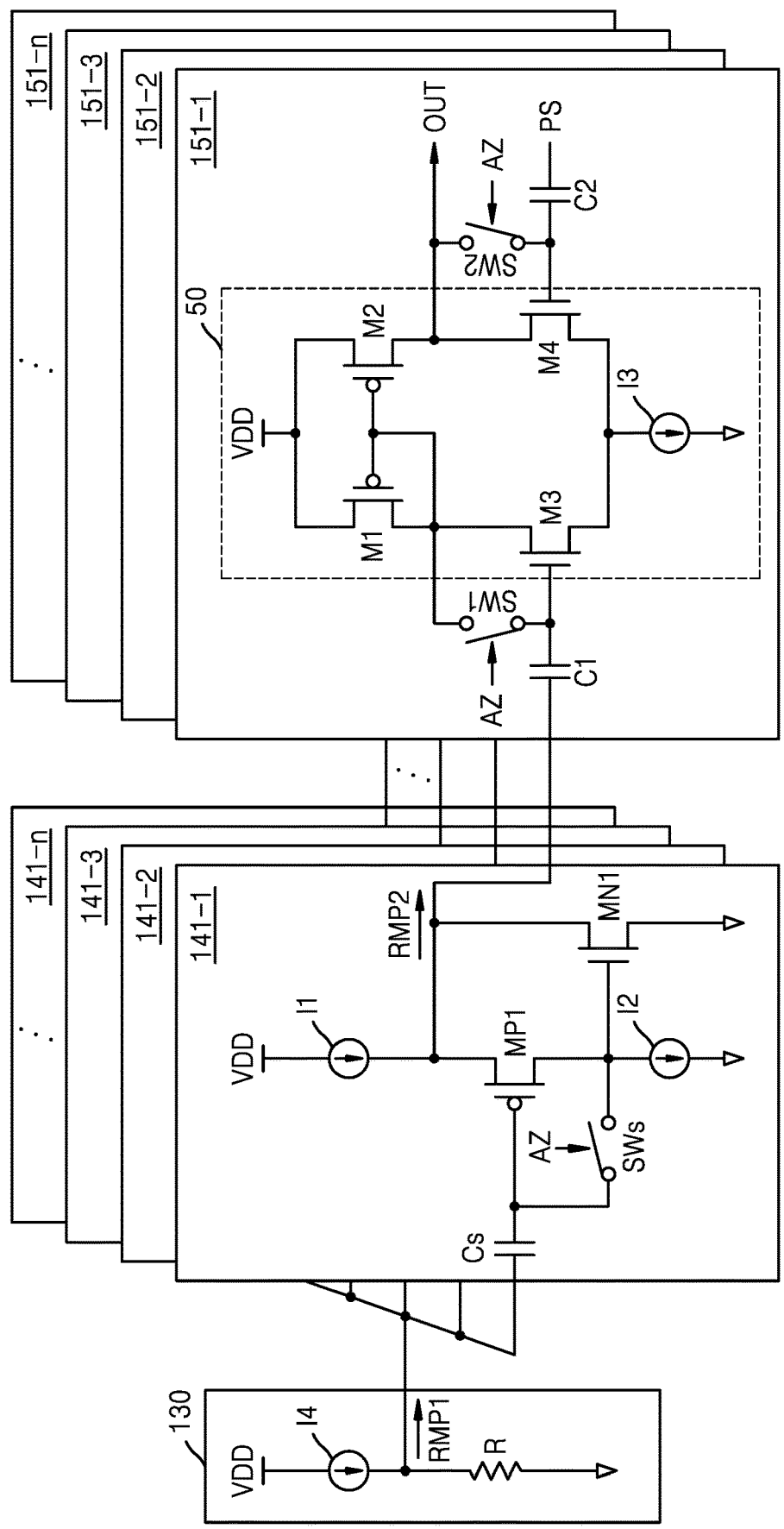

FIGS. 7A and 7B are circuit diagrams illustrating a read circuit including a buffer according to an embodiment.

Referring to FIGS. 7A and 7B, the read circuit may include a ramp signal generator 130, one or more buffers 141, and a plurality of comparators 151-1 through 151-n, where n is a positive number equal to or greater than 4.

The ramp signal generator 130 may include a current source I4 and a resistor R. A first ramp signal RMP1 may be generated as a current source I4 provides a ramp current that increases or decreases linearly or as a resistance value of the resistor R included as a variable resistor increases or decreases linearly. As illustrated in FIGS. 7A and 7B, when a power source voltage VDD is applied to the current source I4, and the resistor R is connected to a ground voltage VSS, the first ramp signal RMP1 may have a low level (voltage level). For example, when the power supply voltage VDD is 2.8 V (volt), the first ramp signal RMP1 may be reduced to an intermediate level of the power supply voltage VDD, for example, from 1.5 V to 0 V.

The input range of the buffer 141 may be shifted to 0 V through the self-biasing operation of the input circuit 10 as described with reference to FIG. 4. Accordingly, even when a level of the first ramp signal RMP1 decreases to a low voltage level, the linearity of the second ramp signal RMP2 may be ensured. On the other hand, since the second ramp signal RMP2 also has a low voltage level, the amplifier 50 of the comparator 151 may be implemented as an OTA operating at a low voltage level, as illustrated in the drawing. Thus, a read circuit including a buffer according to an embodiment may operate at a low voltage level and at low power.

Meanwhile, as illustrated in FIG. 7A, one buffer 141 may provide the second ramp signal RMP2 to the plurality of comparators 151-1 to 151-n. Alternatively, as illustrated in FIG. 7B, a plurality of buffers 141-1 to 141-n may be connected to the plurality of comparators 151-1 to 151-n, respectively. The plurality of comparators 151-1 to 151-n may receive a second ramp signal RMP2 from a buffer connected thereto from among the plurality of buffers 141-1 to 141-n.

Figure 8:
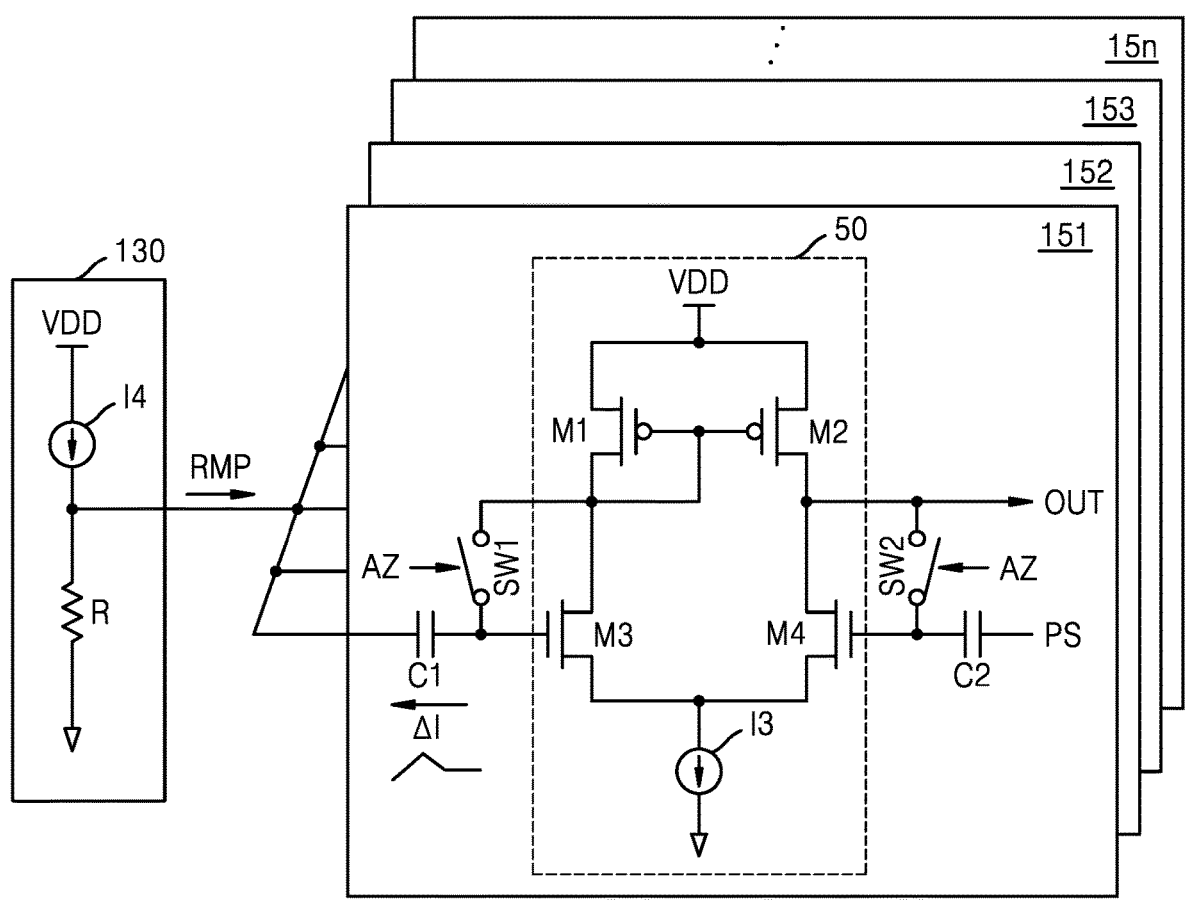
FIG. 8 is a circuit diagram illustrating a read circuit in a comparative example of a read circuit according to an embodiment.

FIG. 8 is a circuit diagram illustrating a read circuit according to a comparative example of a read circuit according to an embodiment.

Referring to FIG. 8, the read circuit according to the comparative example may not include a buffer, and all of the plurality of comparators 151-1 to 151-n may be connected to a ramp signal generator 130 to receive a ramp signal RMP from the ramp signal generator 130.

When at least some of the plurality of comparators 151-1 to 151-n operate, for example, when they operate in a comparison operation period, a kickback noise current $\Delta I$ may be generated, and the kickback noise current $\Delta I$ may flow into the ramp signal generator 130 or into another comparator. Accordingly, noise may be generated at outputs OUT of the plurality of comparators 151 to 151-n, noise may be generated in image data output from the image sensor 100 in FIG. 1, and an image quality may be deteriorated. For example, smear like horizontal noise (SHBN) may occur in the image data.

However, the image sensor (100 in FIG. 1) and the read circuit (FIGS. 7A and 7B) according to an embodiment may have one or more buffers 141 having low output resistance, and the buffer 141 may buffer a ramp signal output from the ramp signal generator 130, that is, a first ramp signal RMP1 to provide the buffered ramp signal, that is, a second ramp signal RMP2, to the plurality of comparators 151-1 to 151-n, and thus, the influence of the kickback noise current $\Delta I$ may be reduced.

Figure 9:
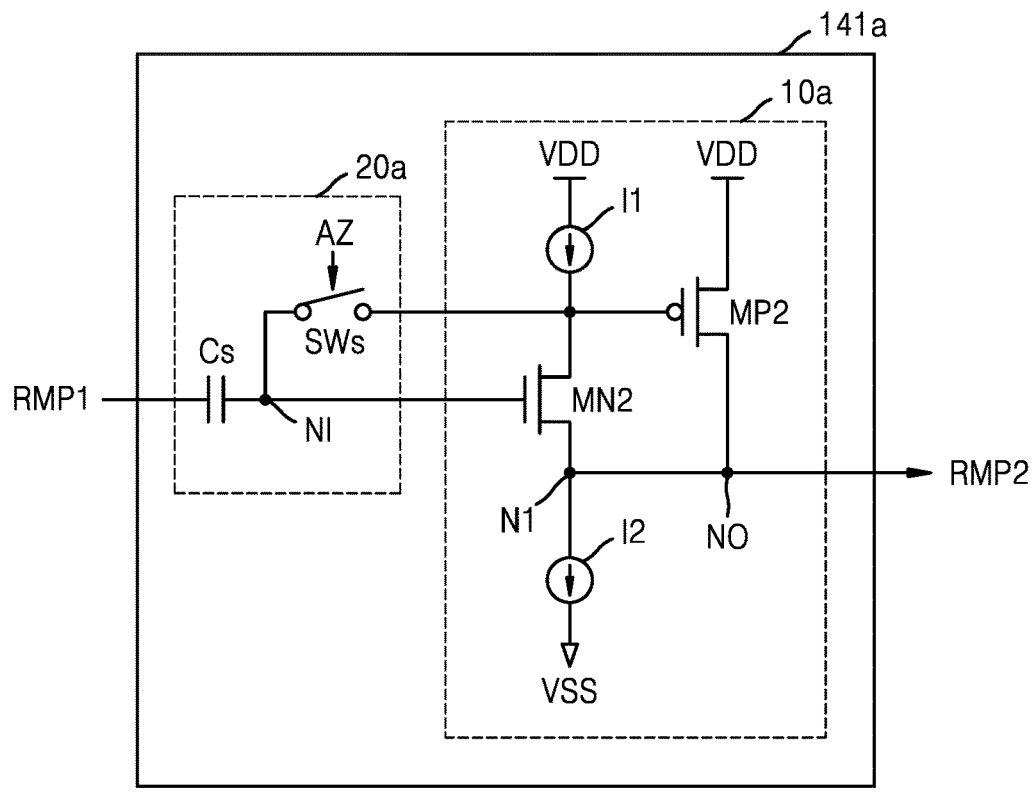
FIG. 9 is a circuit diagram illustrating a buffer according to an embodiment of the inventive concept.

FIG. 9 is a circuit diagram illustrating a buffer according to an embodiment.

A buffer 141a may include an amplifier 10a having a super source follower structure and an input circuit 20a. The amplifier 10a may include a first current source I1, a second current source I2 and a first transistor MN2 that constitute a source follower, and a second transistor MP2 that functions as a negative feedback circuit. The first current source I1 may be connected to the power source voltage VDD and a drain terminal of the first transistor MN2. The second current source I2 may be connected to the ground voltage VSS and a source terminal of the first transistor MN2. A gate terminal of the first transistor MN2 may be connected to an input node NI of the amplifier 10a, and the source terminal of the first transistor MN2 may be connected to an output node NO of the amplifier 10a. A gate terminal of the second transistor MP2 may be connected to the drain terminal of the first transistor MN2, and the drain terminal of the first transistor MN2 may be connected to the source terminal of the first transistor MN2 and the output node NO.

The first transistor MN2 and the second transistor MP2 may be implemented by different types of MOSFET transistors. For example, as illustrated in FIG. 9, the first transistor MN2 may be implemented as an N-type MOS transistor (NMOS), and the second transistor MP2 may be implemented as a P-type MOS transistor (PMOS). At this time, an amount of a first reference current provided by the first current source I1 may be less than an amount of a second reference current provided by the second current source I2.

The input circuit 20a may include a switch SWs connected to the input node NI of the amplifier 10a and the drain terminal of the first transistor MN2, and a capacitor Cs having one end connected to the input node NI of the amplifier 10a and the other end to which a first ramp signal RMP1 is applied. The switch SWs may be implemented as a transmission gate or a PMOS transistor.

The switch SWs may be turned on prior to the comparison operation period (i.e., a period during which the correlated double sampling is performed), and may be turned off during the comparison operation period. The switch SWs is turned on and a voltage of the gate terminal of the second transistor MP2, that is, a gate-source voltage Vgs.mp2 of the second transistor MP2, may be stored in the capacitor Cs. That is, the gate-source voltage Vgs.mp2 of the second transistor MP2 may be sampled at the input node NI by turning on the switch SWs. This self biasing operation has been described with reference to FIG. 4, and a duplicate description will be omitted.

An input range of the buffer 101a may be changed by the self biasing operation of the input circuit 20a, and the buffer 141a may operate normally when the first ramp signal RMP1 is equal to or lower than the power supply voltage VDD. In other words, even when a level of the first ramp signal RMP1 is very high, when the first ramp signal RMP1 is equal to or lower than the power supply voltage VDD, the linearity of the buffer 141a, that is, the linearity of the second ramp signal RMP2 may be ensured.

Figure 10:
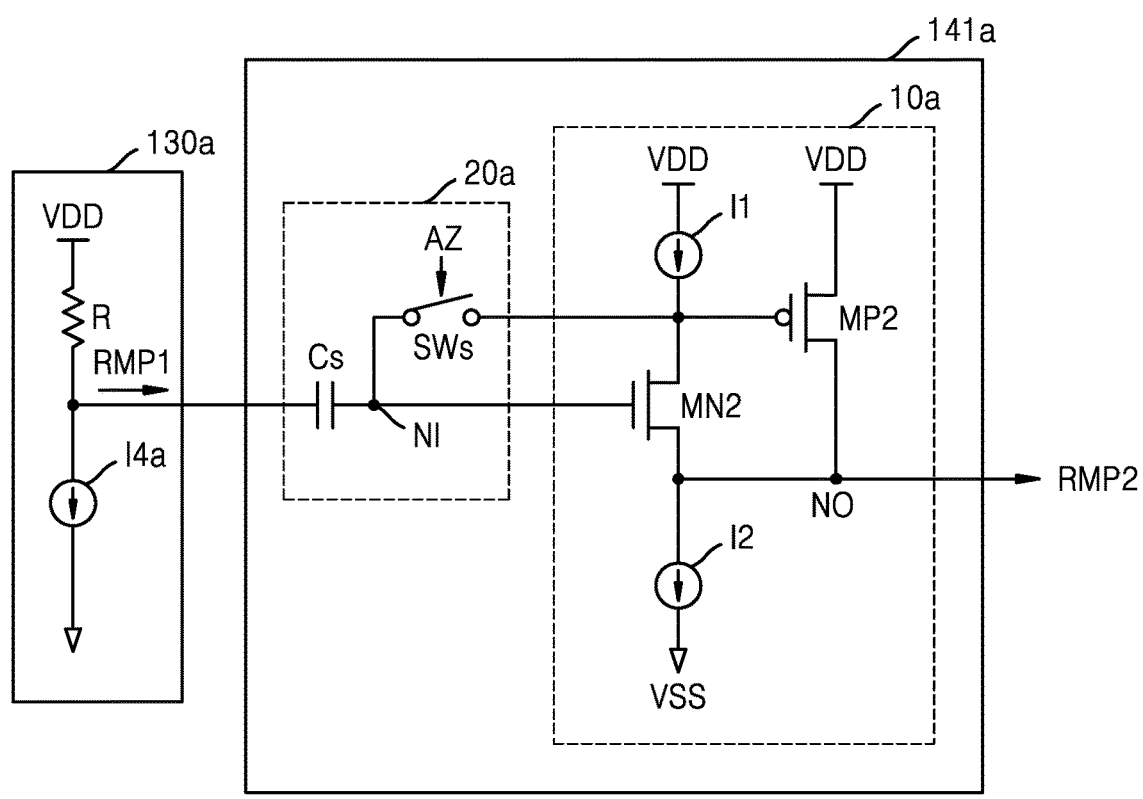
FIG. 10 is a circuit diagram illustrating a read circuit including a buffer according to an example embodiment of the inventive concept.

FIG. 10 is a circuit diagram illustrating a read circuit including a buffer according to an embodiment.

Referring to FIG. 10, the read circuit may include a ramp signal generator 130a and a buffer 141a, and may include a plurality of comparators, as illustrated in FIGS. 7A and 7B.

The ramp signal generator 130a may include a current source I4a and a resistor R. As illustrated above, when the ground voltage VSS is applied to the current source 14a and the resistor R is connected to the power supply voltage VDD, the first ramp signal RMP1 may have a high level (voltage level). For example, when the power supply voltage VDD is 2.8 V (volt), the first ramp signal RMP1 may increase to an intermediate level of the power supply voltage VDD, for example, from 1.4 V to 2.8 V.

The input range of the buffer 141a may be shifted to the power supply low voltage VDD through the self-biasing operation of the input circuit 10a as described with reference to FIG. 9. Accordingly, even when the level of the first ramp signal RMP1 increases to a high voltage, the linearity of the second ramp signal RMP2 may be ensured. Meanwhile, since the second ramp signal RMP2 also has a high level, a comparator to which the second ramp signal RMP2 is provided may be implemented using an amplifier circuit, for example, OTA, which operates at a high voltage level.

Figure 11A:
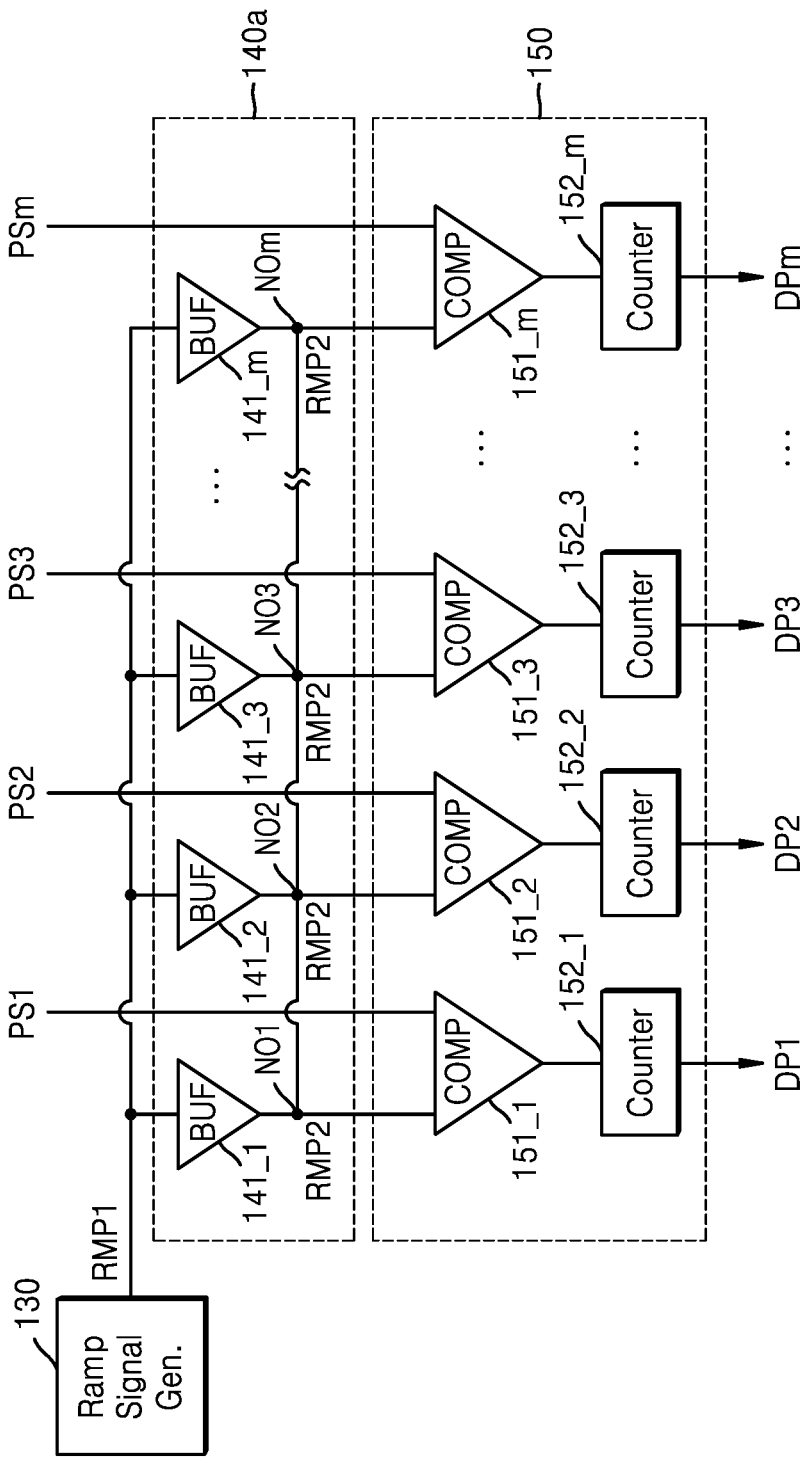
FIGS. 11A, 11B, and 11C illustrate buffer circuits according to an example embodiment.
Figure 11B:
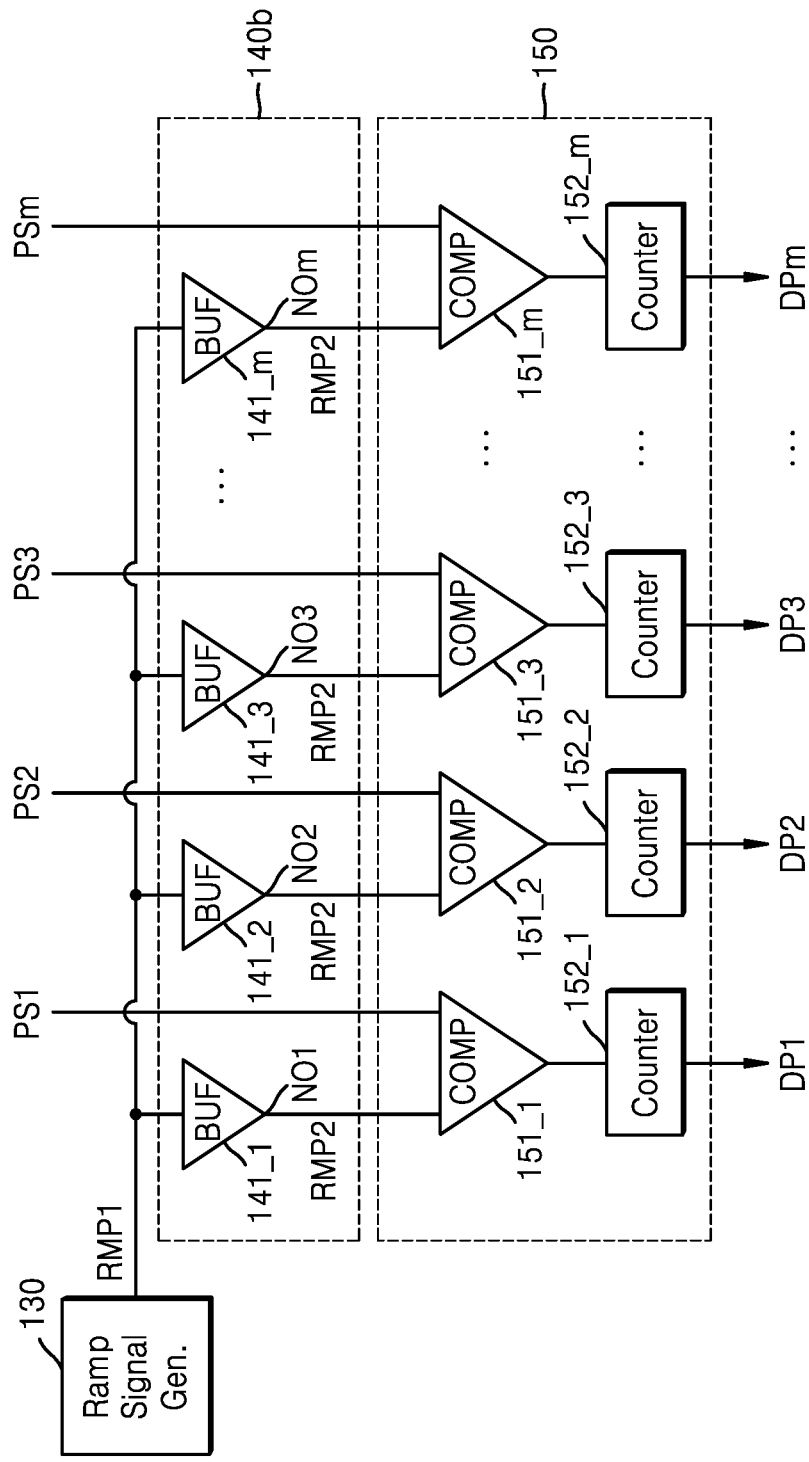
Figure 11C:
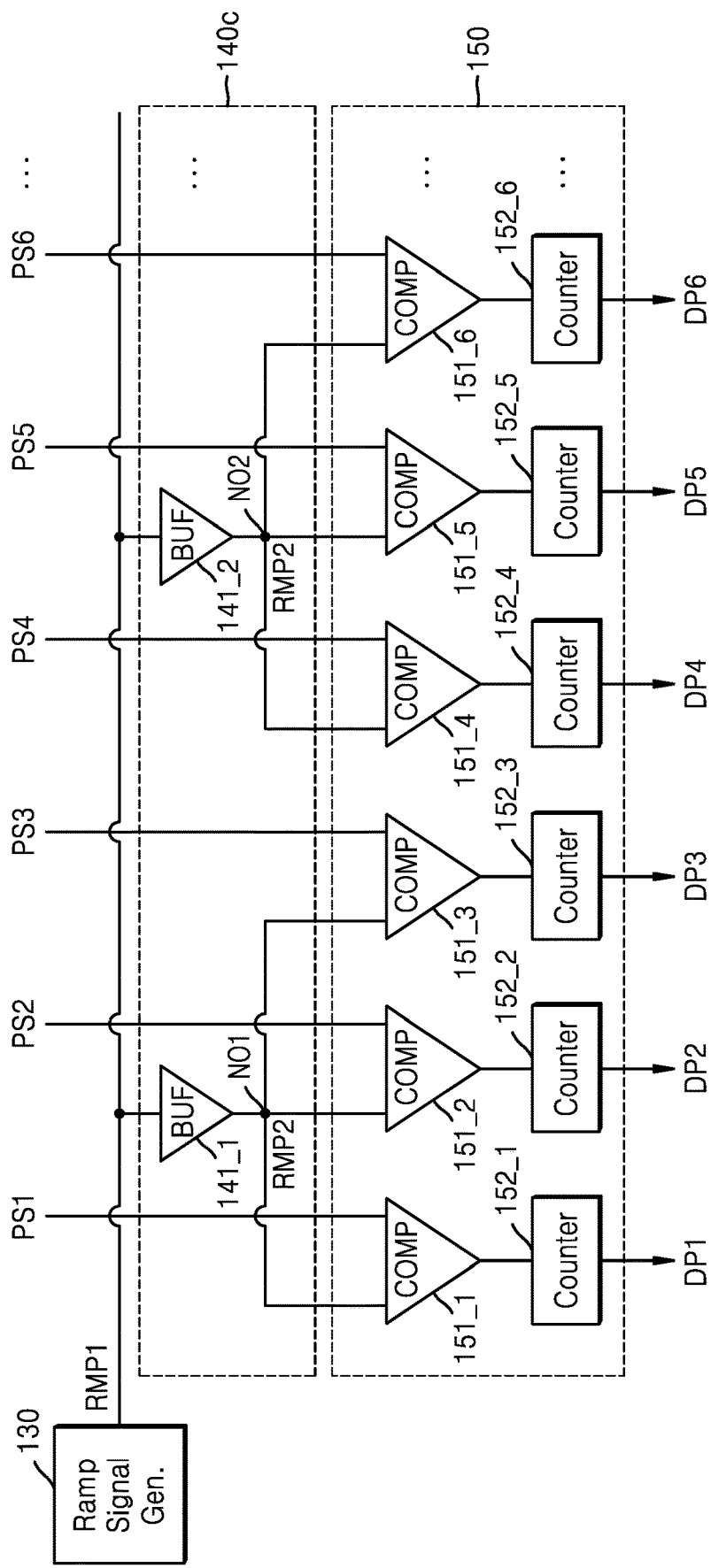

FIGS. 11A, 11B and 11C illustrate buffer circuits according to embodiments. A ramp signal generator 130 and an analog-to-digital conversion circuit 150 will be illustrated together for convenience of explanation.

Referring to FIG. 11A, the analog-to-digital conversion circuit 150 may include first to m-th comparators 150_1 to 150_m (m is a positive number equal to 4 or more) and first to m-th counters 152_1 to 152_m, and a buffer circuit 140a may include first to m-th buffers 141_1 through 141_m.

The first to m-th comparators 150_1 to 150_m may receive first to m-th pixel signals PS1 to PSm, respectively, and may compare the received pixel signals with the second ramp signal RMP2 output from the buffer circuit 140a to output a comparison result. The first to m-th counters 152_1 to 152_m may generate first to m-th digital pixel values DP1 to DPm by counting outputs of comparators corresponding to the first to m-th counters 152_1 to 152_m, that is, a comparison result.

On the other hand, in FIG. 11A, first to n-th output nodes NO1 to NOm of the first to m-th buffers 141_1 to 141_m may be connected to one another. The first to m-th buffers 141_1 to 141_m may operate as one buffer. However, in a layout of an actual image sensor (e.g., 100 in FIG. 1), as illustrated in FIG. 11A, the first to m-th buffers 141_1 to 141_m may be arranged to correspond the arrangement structure of the first to m-th comparators 150_1 to 150_m and the first to m-th counters 152_1 to 152_m structure, respectively.

Referring to FIG. 11B, a buffer circuit 140b may include first to m-th buffers 141_1 to 141_m. The first through m-th buffers 141_1 to 141_m may be connected to first to m-th comparators 150_1 to 150_m, respectively. First to n-th output nodes NO1 to NOm of the first to m-th buffers 141_1 to 141_m may not be connected to each other. The first through m-th comparators 150_1 through 150_m may receive a second ramp signal RMP2 from buffers connected thereto, from among the first through m-th buffers 141_1 through 141_m. In FIG. 11B, a buffer, a comparator, and a counter may operate as one unit read circuit. For example, the first buffer 141_1, the first comparator 151_1, and a first counter 152_1 may operate as a read circuit for converting a first pixel signal PS1 into a first digital pixel value DP1.

Referring to FIG. 11C, a buffer circuit 140c may include two or more buffers 141_1 and 142_2. Two buffers are illustrated in FIG. 11C, but the inventive concept is not limited thereto. However, the number of buffers may be less than the number of comparators, for example, the first to sixth comparators 151_1 to 151_6 and the counters, for example, the first to sixth counters 152_1 to 152_6. Some of the first to sixth comparators 151_1 to 151_6, for example, the first to third comparators 151_1 to 151_3 may be connected to the first buffer 141_1, and fourth to sixth comparators 151_4 to 151_6 may be connected to the second buffer 141_2. Accordingly, the first to third comparators 151_1 to 151_3 may receive a second ramp signal RMP2 output from the first output node NO1 of the first buffer 141_1, and the fourth to sixth comparators 151_4 to 151_6 may receive a second ramp signal RMP2 output from the second output node NO2 of the second buffer 141_2. A plurality of comparators may be grouped, and comparators of different groups may receive a second ramp signal RMP2 from different buffers.

Figure 12:
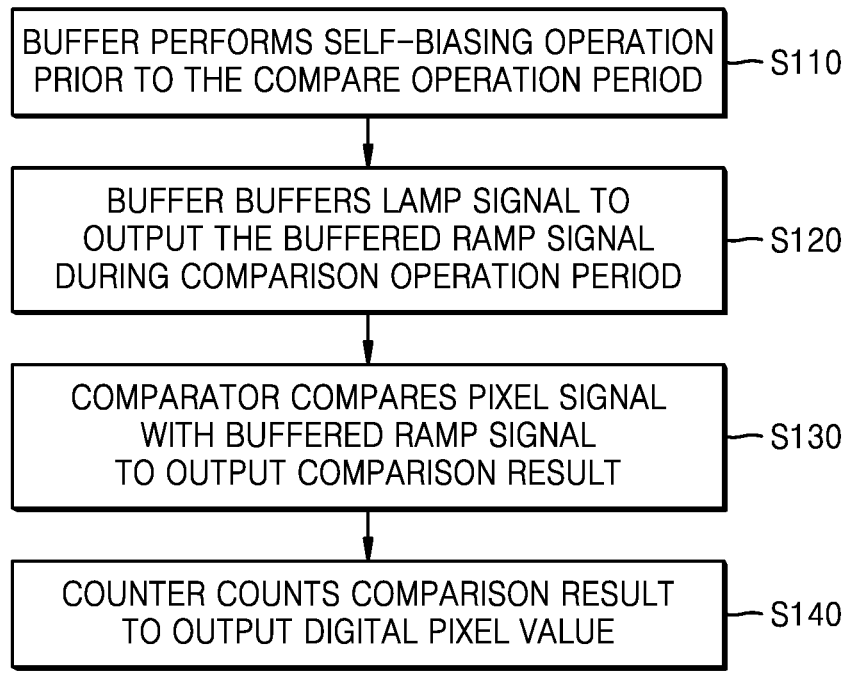
FIG. 12 is a flowchart of an operating method of an image sensor according to an embodiment.

FIG. 12 is a flowchart of an operation method of an image sensor according to an embodiment. Specifically, FIG. 12 illustrates an operation of the buffer 141, a comparator 151 and a counter 152 shown in FIG. 1.

Referring to FIG. 12, in S110, the buffer 141 may perform a self-biasing operation prior to a comparison operation period. For example, the buffer 141 may perform a self-biasing operation in an auto-zero period (Taz in FIG. 3B). The input range of the buffer 141 may be shifted by the self biasing operation, and thus may be matched with a range of a ramp signal output from a ramp signal generator. As described with reference to FIG. 3A, the comparator 151 in the auto-zero period may perform an auto-zero operation, thereby eliminating an internal offset.

In S120, in the comparison operation period, the buffer 141 may buffer the ramp signal to output the buffered ramp signal. The buffer 141 may buffer a first ramp signal RMP1 output from the ramp signal generator 130 in FIG. 1 to output a second ramp signal RMP2 that is obtained by buffering the first ramp signal RMP1.

In S130, the comparator 151 may compare a pixel signal with the buffered ramp signal to output a comparison result. The comparator 141 may compare the pixel signal with the second ramp signal RMP2 provided from the buffer 141 to output the comparison result. The comparator 151 may perform a comparison operation in the reset conversion period (Trst in FIG. 3B) and the signal conversion period (Tsig in FIG. 3B).

In S140, the counter 152 may count the comparison result output from the comparator 151 to output a digital pixel value. The counter 152 may count the comparison result in the reset conversion period Trst and the signal conversion period Tsig.

Digital pixel values according to double correlation sampling may be generated according to the operation of the comparator 151 and the counter 152.

Figure 13:
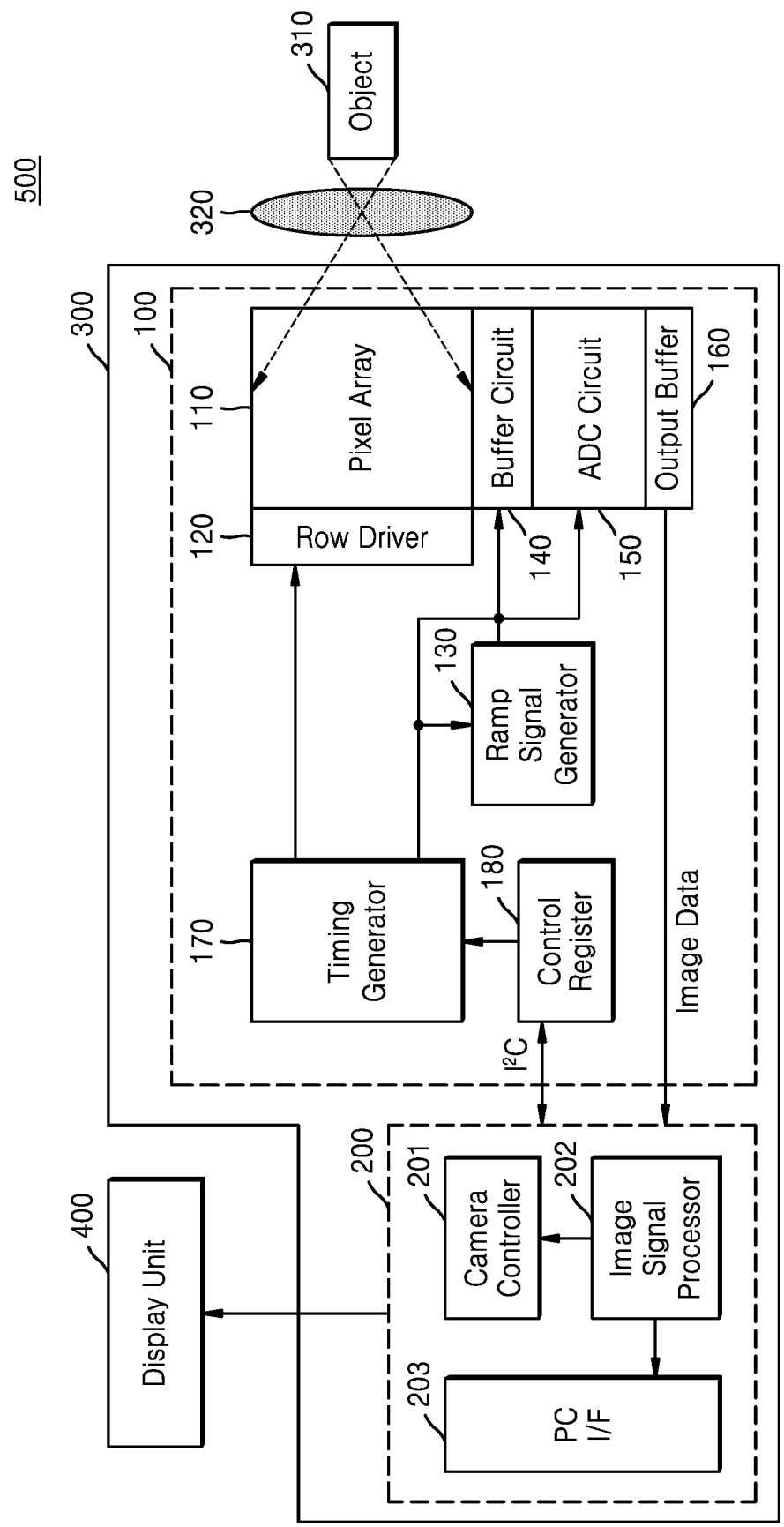
FIG. 13 is a block diagram illustrating an image processing system according to an embodiment.

FIG. 13 is a block diagram illustrating an image processing system according to an embodiment.

Referring to FIG. 13, an image processing system 300 according to an embodiment may include an image sensor 100 and an image processor 200. The image processing system 300 may be mounted on an electronic device 500 together with a display unit 400 and a lens 320.

The image sensor 100 may include a pixel array 110, a row driver 120, a ramp signal generator 130, a buffer circuit 140, an analog-to-digital conversion circuit 150, an output buffer 160, a timing generator 170, and a control register 180. The image sensor 100 may further include a memory for storing image data output from the output buffer 160.

The image sensor 100 may sense an object 310, an image of which is captured through the lens 320 under the control of the image processor 200, and output, to the display unit 300, the image data sensed and output by the image sensor 100. In this case, the display unit 300 may include all devices capable of outputting an image. For example, the display unit 300 may include a computer, a mobile phone, and other image output terminals.

The image processor 200 may include a camera controller 201, an image signal processor 202, and an interface 203. The camera controller 201 may provide a control command for controlling the image sensor 100, for example, a setting command, to the control register 180. In an embodiment, the camera controller 201 may communicate with the control register 180 by using an inter-integrated circuit (I2C). However, the inventive concept is not limited thereto, and various interfaces may be applied between the camera controller 201 and the control register 180.

The image signal processor 202 may receive the image data from the buffer 160, and may process the image data to output the processed image to the display unit 400. Alternatively, the image signal processor 202 may receive a control signal from the outside, for example, a host processor, through an interface 203 and provide the processed image to an external host. In FIG. 13, the image signal processor 202 is illustrated as being located within the image processor 200, but the inventive concept is not limited thereto, and the image signal processor 202 may be located outside the image sensor 100.

Meanwhile, as the image sensor 100, the image sensor 100 described with reference to FIG. 1 may be applied. The control register 180 may decode a control command received from the camera controller 201 to generate an internal command and provide the internal command to the timing generator 170. The timing generator 170 may generate control signals for controlling the operation timings of the row driver 120, the ramp signal generator 130, the buffer 140, the analog-to-digital conversion circuit 150, and the output buffer 160 based on the internal command (for example, a mode setting command, a timing adjustment command, etc.) received from the control register 180.

As described above, in the image sensor 100 according to an embodiment, at least one buffer included in the buffer circuit 140 may include an amplifier of a super source follower structure and an input circuit. The input circuit may perform a self-biasing during a period before a comparison operation of the analog-to-digital conversion circuit 150 is performed, for example, in an auto-zero period, for example, and accordingly, an input range of the at least one buffer may calibrate the input range of the at least one buffer to match a range of a ramp signal output from the ramp signal generator 130. Afterward, when the comparison operation is performed, the amplifier may buffer the ramp signal output from the ramp signal generator 130, for example, a first ramp signal, and the buffered ramp signal, for example, a second ramp signal, may be provided to the comparator 151 of the analog-to-digital conversion circuit 150 shown in FIG. 1. Accordingly, since the buffer of the super source follower structure having a low output impedance provides the buffered ramp signal, the influence of kickback noise may be reduced, and the linearity of the second ramp signal may be maintained, thus improving image quality of image data. In addition, since the image sensor 100 may operate at a low voltage level, the power consumption of the image sensor 100 may be reduced.

Figure 14:
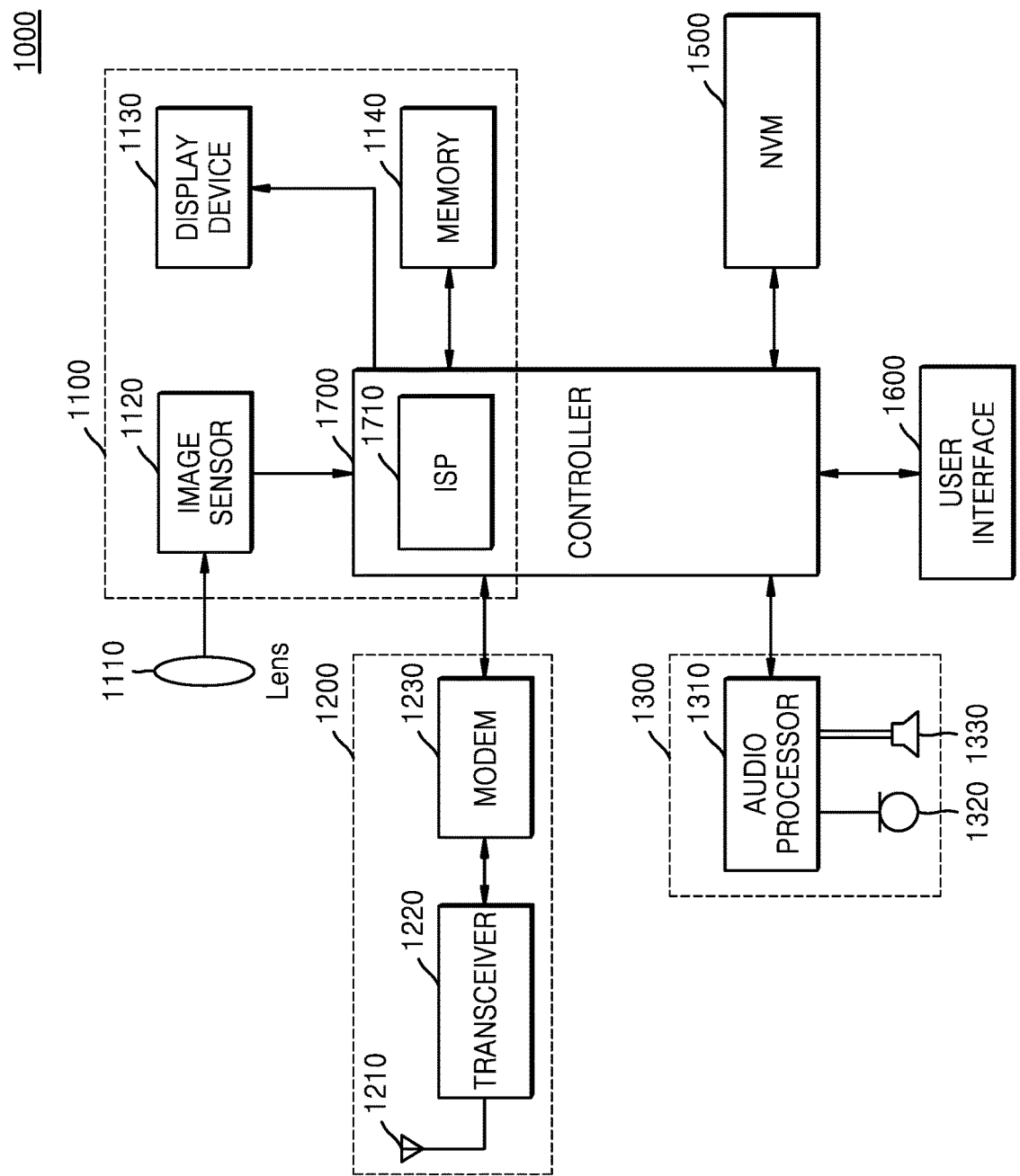
FIG. 14 is a block diagram illustrating a portable terminal according to an embodiment.

FIG. 14 is a block diagram illustrating a portable terminal according to an embodiment. Referring to FIG. 14, a portable terminal 1000 according to an embodiment may include an image processing unit 1100, a wireless transceiver 1200, an audio processing unit 1300, a nonvolatile memory device 1500, a user interface 1600, and a controller 1700.

The image processing unit 1100 may include a lens 1110, an image sensor 1120, a display device 1120, a memory 1140, and an image signal processor 1710. The image signal processor 1710 in an embodiment may be implemented as part of the controller 1700 as illustrated.

The image sensor 100 of FIG. 1 may be applied as the image sensor 1120 of FIG. 1. At least one buffer included in the buffer circuit 140 of the image sensor 1120 may include an amplifier of a super source follower structure, and the amplifier may buffer a ramp signal output from the ramp signal generator 130, for example, a first ramp signal, and may provide a buffered ramp signal, for example, a second ramp signal, to a comparator (151 in FIG. 1) of the analog to digital conversion circuit 150. In addition, an input circuit included in at least one buffer may perform a self-biasing operation, thereby shifting an input range of the at least one buffer. Accordingly, linearity of the at least one buffer may be maintained while having a super source follower structure.

The image signal processor 1710 may perform image processing on an image provided from the image sensor 1120, for example, a raw image, to generate a transformed image, store the transformed image in the memory 1140, or scale the transformed image and provide the scaled image to the display device 1130.

The wireless transceiver 1210 may include an antenna 1210, a transceiver 1220, and a modem 1230. The audio processing unit 1300 may include an audio processor 1310, a microphone 1320, and a speaker 1330. The nonvolatile memory device 1500 may be provided as a memory card (MMC, eMMC, SD, micro SD) or the like.

The user interface may be implemented using various devices capable of receiving a user input, such as a keyboard, a curtain key panel, a touch panel, a fingerprint sensor, and a microphone. The user interface may receive a user input and provide a signal corresponding to the received user input, to the controller 1700.

The controller 1700 may control an overall operation of the portable terminal 1000 and be provided as a system-on-chip (SoC) that drives an application program, an operating system, and the like. A kernel of an operating system running on an SoC may include a device driver for controlling an I/O scheduler and the nonvolatile memory device 1500.

At least one of the components, elements, modules or units (collectively "components" in this paragraph) represented by a block in the drawings may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

As described above, example embodiments have been provided in the drawings and specification. Although the embodiments have been described herein with reference to specific terms, it should be understood that they have been used only for the purpose of describing the technical idea of the present inventive concept and not for limiting the scope of the present inventive concept as defined in the claims. Therefore, those skilled in the art will appreciate that various modifications and equivalent embodiments are possible without departing from the scope of the present inventive concept. Accordingly, the true scope of protection of the inventive concept should be determined by the technical idea of the appended claims.

While the inventive concept has been particularly illustrated and described with reference to embodiments thereof, it will be understood that various changes in form and details may be made therein without departing from the spirit and scope of the following claims.

What is claimed is:

1. An image sensor comprising:
a pixel array comprising a plurality of pixels;
a ramp signal generator configured to generate a first ramp signal;
a buffer comprising:
an amplifier, and configured to output a second ramp signal obtained by buffering the first ramp signal; and
an input circuit configured to receive the first ramp signal and provide a voltage obtained by adding a biasing voltage to the first ramp signal, as an input signal to the amplifier,
wherein the input circuit comprises:
a capacitor configured to receive the first ramp signal through one end of the capacitor, the other end of the capacitor being connected to an input node of the amplifier; and
a switch coupled to the input node and a first node of the amplifier; and
an analog-to-digital conversion circuit configured to compare a pixel signal output from the pixel array with the second ramp signal and convert the pixel signal to a pixel value.

2. The image sensor of claim 1, wherein the amplifier comprising:
a first transistor having a gate terminal connected to the input node, a source terminal connected to an output node and a drain terminal connected to the first node;
a first current source coupled to the source terminal of the first transistor and providing a first reference current;
a second current source coupled to the first node and providing a second reference current; and
a second transistor having a gate terminal connected to the first node and operating as a negative feedback circuit.

3. The image sensor of claim 2, wherein the first transistor comprises a first conductivity type transistor, and the second transistor and the switch comprise a second conductivity type transistor.

4. The image sensor of claim 1, wherein the switch is turned on in a first period to store a voltage of the first node in the capacitor, and is turned off in a second period after the first period.

5. The image sensor of claim 4 further comprising a plurality of buffers including the buffer,
wherein the buffers are configured to output respective second ramp signals based on the buffered first ramp signal,
wherein the analog-to-digital conversion circuit comprises a plurality of comparators configured to respectively receive a plurality of pixel signals output from the pixel array, and compare the received pixel signals to the second ramp signal provided from the buffers, and
wherein the comparators are configured to perform a correlated double sampling operation based on the second ramp signal and the pixel signals in the second period.

6. The image sensor of claim 5, wherein the plurality of comparators perform an auto-zero operation for matching an input voltage level and an output voltage level in the first period to eliminate an internal offset of the comparator.

7. The image sensor of claim 4, wherein the analog-to-digital conversion circuit comprises a plurality of analog-to-digital converters configured to respectively receive a plurality of pixel signals output from the pixel array, and
wherein each of the plurality of the analog-to-digital conversion circuit comprises:
a plurality of comparators configured to compare the received pixel signals with the second ramp signal, respectively; and
a counter configured to count an output of each of the plurality of comparators.

8. The image sensor of claim 7, further comprising a plurality of buffers including the buffer,
wherein the buffers are configured to output respective second ramp signals based on the buffered first ramp signal to the analog-to-digital converters.

9. An image sensor comprising:
a pixel array comprising a plurality of pixels;
a ramp signal generator configured to generate a first ramp signal;
a buffer circuit comprising a plurality of buffers, each of which buffers the first ramp signal to generate a second ramp signal,
wherein each of the buffers comprises:
an amplifier comprising an amplifier circuit and a negative feedback circuit; and
an input circuit connected to an input node of the amplifier to generate an input signal by adding an offset signal of the negative feedback circuit to the first ramp signal; and a plurality of analog-to-digital converters configured to compare a plurality of pixel signals output from the pixels with the second ramp signal to generate pixel values.

10. The image sensor of claim 9, wherein the input circuit comprises:
a capacitor having one end through which the first ramp signal is received and the other end connected to the input node of the amplifier circuit; and
a switch connected to the input node of the amplifier circuit and a first node to which the amplifier circuit and the negative feedback circuit are connected,
wherein the switch is turned on before a first period in which the analog-to-digital converters generate the pixel values, and is turned off in the first period.

11. The image sensor of claim 9, wherein the analog-to-digital converters are divided into a plurality of groups, and
wherein analog-to-digital converters included in a first group from among the groups receive the second ramp signal from a first buffer from among the buffers, and analog-to-digital converters included in a second group from among the groups receive the second ramp signal from a second buffer from among the buffers.

12. The image sensor of claim 9, wherein each of the analog-to-digital converters receive the second ramp signal from a corresponding buffer from among the buffers.

13. An operating method of an image sensor, the operating method comprising:
changing, by using a buffer, an input range of the buffer by performing an input sampling operation in a first period;
outputting, by using the buffer, a buffered ramp signal by buffering a received ramp signal in a second period;
by using a comparator, comparing a pixel signal and the buffered ramp signal and outputting a comparison result in the second period; and
generating, by using a counter, a pixel value by counting the comparison result in the second period,
wherein a level of the received ramp signal is adjusted according to a threshold voltage of a transistor performing a negative feedback operation in the buffer.

14. The operating method of claim 13, further comprising removing an internal offset of the comparator in the first period.

15. The operating method of claim 13, wherein a level of the received ramp signal received by the buffer is adjusted by the input sampling operation.

16. The operating method of claim 15, wherein a switch provided at an input terminal of the buffer is turned on in the first period to store the threshold voltage in a capacitor, and
wherein, in the second period, the switch is turned off, and the capacitor receives the buffered ramp signal and provides an amplifier of the buffer with a signal corresponding to the buffered ramp signal in which the threshold voltage is added.

* * * * *